United States Patent
Wu et al.

(10) Patent No.: US 12,027,550 B2
(45) Date of Patent: Jul. 2, 2024

(54) DISPLAY PANEL AND DISPLAY DEVICE FOR REDUCING COLOR DEVIATION

(71) Applicant: Shanghai Tianma Micro-Electronics Co., Ltd., Shanghai (CN)

(72) Inventors: Yaodong Wu, Shanghai (CN); Yang Zeng, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 331 days.

(21) Appl. No.: 17/405,298

(22) Filed: Aug. 18, 2021

(65) Prior Publication Data

US 2021/0375969 A1 Dec. 2, 2021

(30) Foreign Application Priority Data

Apr. 30, 2021 (CN) .......................... 202110481304.4

(51) Int. Cl.
*H01L 27/146* (2006.01)
*H10K 59/38* (2023.01)
*H10K 59/65* (2023.01)
*G06V 40/13* (2022.01)

(52) U.S. Cl.
CPC .. *H01L 27/14623* (2013.01); *H01L 27/14678* (2013.01); *H10K 59/38* (2023.02); *H10K 59/65* (2023.02); *G06V 40/1318* (2022.01)

(58) Field of Classification Search
CPC ......... H10K 59/65; H10K 59/38; H01L 33/08
See application file for complete search history.

(56) References Cited

U.S. PATENT DOCUMENTS

2023/0006015 A1\* 1/2023 Sun .................. H10K 59/65

FOREIGN PATENT DOCUMENTS

| CN | 210535236 U | 5/2020 |
| CN | 111725264 A | 9/2020 |
| CN | 111816114 A | 10/2020 |

OTHER PUBLICATIONS

Machine Translation of IDS document, CN111725264A, published Sep. 29, 2019.*

\* cited by examiner

*Primary Examiner* — Suberr L Chi
(74) *Attorney, Agent, or Firm* — CHRISTENSEN O'CONNOR JOHNSON KINDNESS PLLC

(57) ABSTRACT

Provided is a display panel having a display region and a non-display region, and the display panel includes: a substrate; light-emitting elements disposed at a side of the substrate and located in the display region, each of light-emitting elements includes a light-emitting layer; and a light-shielding layer disposed at a side of the light-emitting elements facing away from the substrate, the light-shielding layer includes first apertures, and in a direction perpendicular to the substrate, each first aperture does not overlap with the light-emitting layer. In an embodiment, a distance between a first point on an edge of a first orthographic projection and a second point on an edge of a second orthographic projection is defined as a distance L, which satisfies $$L \geq \frac{d \times \sin\theta}{\sqrt{n^2 - \sin^2\theta}},$$

where d denotes a distance between the light-emitting layer and the light-shielding layer, n denotes a refractive index of a functional film layer, θ denotes a visible angle and 0°<θ<90°.

20 Claims, 15 Drawing Sheets

DISPLAY PANEL AND DISPLAY DEVICE FOR REDUCING COLOR DEVIATION

CROSS-REFERENCE TO RELATED APPLICATIONS

The present application claims priority to Chinese Patent Application No. 202110481304.4, filed on Apr. 30, 2021, the content of which is incorporated herein by reference in its entirety.

TECHNICAL FIELD

The present disclosure relates to the field of display technologies, and in particular, to a display panel and a display device.

BACKGROUND

For a display panel with fingerprint recognition function, display light of the panel is conventionally used as detection light for fingerprint recognition. When a finger touches the panel, light emitted from a light-emitting element is transmitted to the finger and is then reflected by the finger, and the reflected light enters a fingerprint recognition module. The fingerprint recognition module collects the reflected light from different positions to generate fingerprint images at different positions, and then obtain a complete fingerprint image through synthetic analysis.

Conventionally, in order to reduce reflection of ambient light by a metal layer in the panel, a light-shielding layer is provided at a light-exiting side of the display panel, and, in order to allow the light reflected by the finger to normally enter the fingerprint recognition module, a plurality of apertures are formed in the light-shielding layer. However, after the plurality of apertures are formed, an amount of light that exits from the panel at a large angle increases. This may result in color deviation at a viewing angle and thus bring an adverse effect to the display effect.

SUMMARY

In view of this, the embodiments of the present disclosure provide a display panel and a display device, aiming to alleviate color deviation at a visible angle of the panel.

In a first aspect, an embodiment of the present disclosure provides a display panel, having a display region and a non-display region, and the display panel including: a substrate; a plurality of light-emitting elements disposed at a side of the substrate and located in the display region, wherein each of the plurality of light-emitting elements comprises a light-emitting layer; and a light-shielding layer disposed at a side of the plurality of light-emitting elements facing away from the substrate, wherein the light-shielding layer comprises first apertures, and in a direction perpendicular to a plane of the substrate, each of the first apertures does not overlap with the light-emitting layer. In an embodiment, an orthographic projection of the light-emitting layer on the substrate is a first orthographic projection, an orthographic projection of each of the first apertures on the substrate is a second orthographic projection, an edge of the first orthographic projection comprises a first point, an edge of the second orthographic projection comprises a second point, a distance between the first point and the second point is defined as a distance between the first orthographic projection and the second orthographic projection, and the distance L between the second orthographic projection and at least one first orthographic projection adjacent to the second orthographic projection satisfies $$L \geq \frac{d \times \sin\theta}{\sqrt{n^2 - \sin^2\theta}},$$

where d denotes a distance between the light-emitting layer and the light-shielding layer, n denotes a refractive index of a functional film layer of the display panel located at a side of the light-shielding layer facing away from the substrate, and $\theta$ denotes a visible angle of the display panel and $0°<\theta<90°$.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association describing associated objects, indicating that there may be three relationships, for example, "A and/or B" indicates three cases, i.e., only A is presented, both A and B are presented, and only B is presented. In addition, the character "/" herein generally indicates that the associated objects form an "or" relationship therebetween.

It should be understood that although the orthographic projections may be described using the terms of "first", "second", etc., in the embodiments of the present disclosure, the orthographic projection will not be limited to these terms. These terms are merely used to distinguish orthographic projections from one another. For example, without departing from the scope of the embodiments of the present disclosure, a first orthographic projection may also be referred to as a second orthographic projection, and similarly, a second orthographic projection may also be referred to as a first orthographic projection.

Before describing the technical solutions provided by the embodiments of the present disclosure, the problems existing in the related art will be first described in the following.

Figure 1:
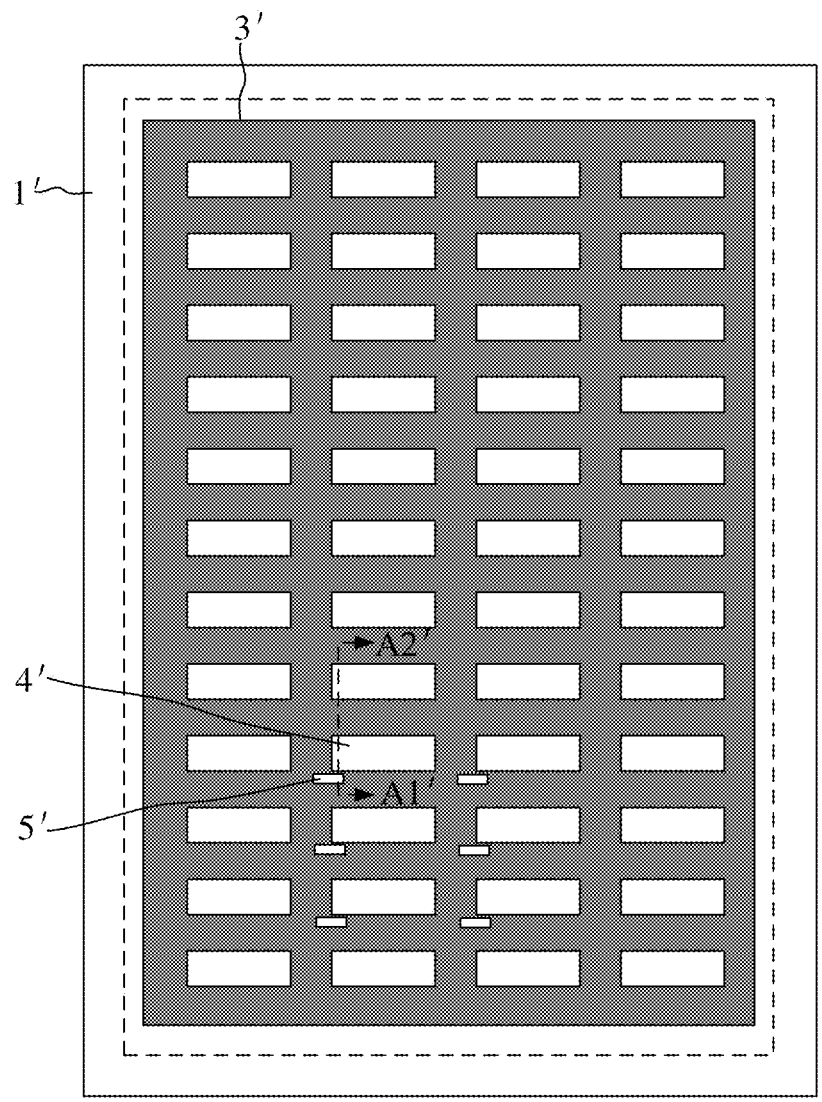
FIG. 1 is a top view of a display panel in the related art.
Figure 2:
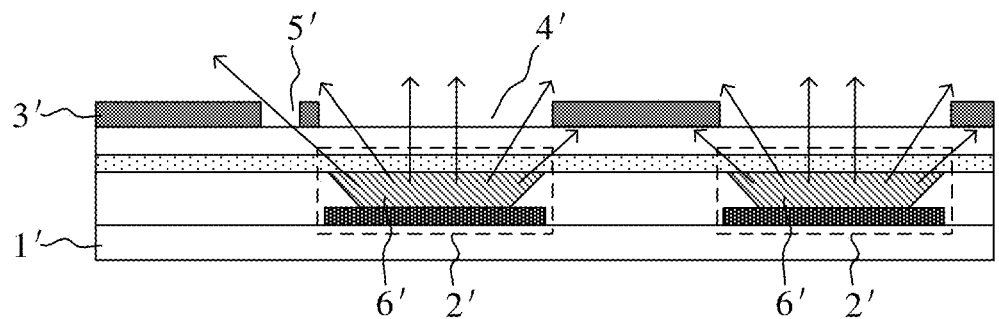
FIG. 2 is a cross-sectional view along A1'-A2' direction shown in FIG. 1.

FIG. 1 is a top view of a display panel in the related art. FIG. 2 is a cross-sectional view along A1'-A2' shown in FIG. 1. As shown in FIG. 1 and FIG. 2, the display panel includes a substrate 1', and a plurality of light-emitting elements 2' are provided at a side of the substrate 1'. A light-shielding layer 3' is provided at a side of the light-emitting element 2' facing away from the substrate 1'.

The light-shielding layer 3' includes openings 4' and apertures 5'. In a direction perpendicular to a plane of the substrate 1', the opening 4' overlaps with a light-emitting layer 6' of the light-emitting element 2', and the aperture 5' does not overlap with the light-emitting layer 6' of the light-emitting element 2'. When the display panel displays an image, light emitted from the light-emitting layer 6' passes through the opening 4' to exit from the panel. When the display panel performs fingerprint recognition, light emitted from the light-emitting layer 6' is transmitted to a finger through the opening 4' and is then reflected by the finger, and the reflected light enters a fingerprint recognition module through the aperture 5' to be collected by the fingerprint recognition module.

After research, it has been found that, in the related art, a distance between the aperture 5' and the opening 4' is relatively small. Referring again to FIG. 2, when the display panel displays an image, light emitted from the light-emitting layer 6' that is transmitted at certain angles will pass through the aperture 5' to exit from the panel, resulting in an increase in the amount of light at this light-exiting angle.

Figure 3:
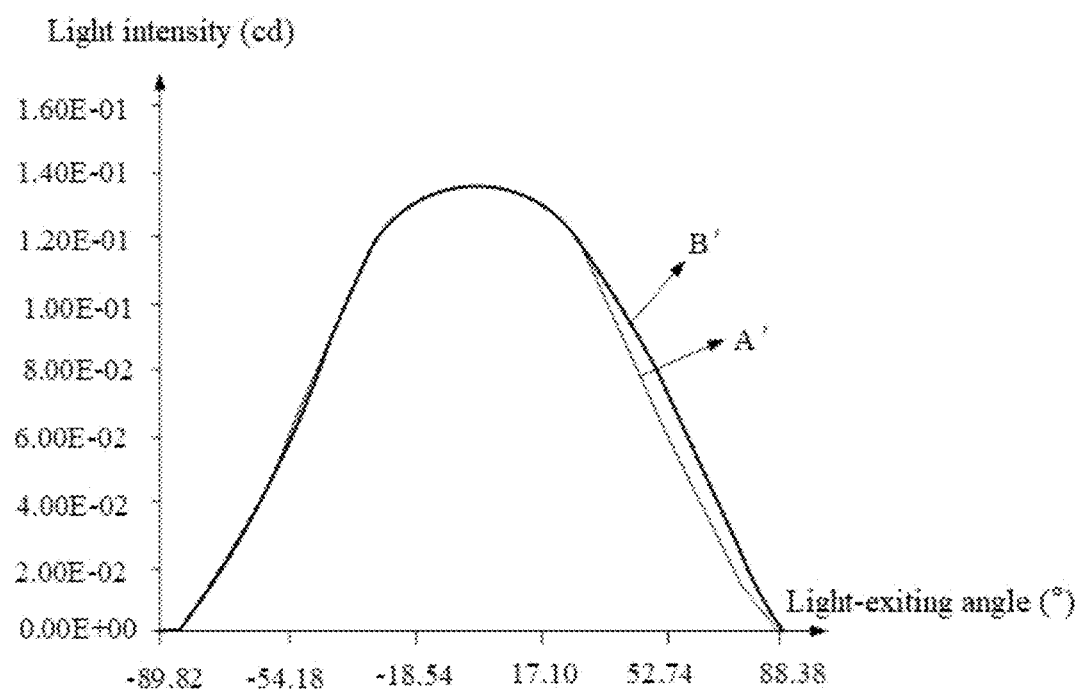
FIG. 3 shows a schematic curve simulation diagram of light-exiting angle vs. light intensity according to a structure of a panel in the related art.

As shown in FIG. 3, which shows a schematic curve simulation diagram of light-exiting angles vs. light intensities according to a structure of a panel in the related art, where a curve A' represents the light-exiting angle vs. light intensity in a case where the light-shielding layer 3' is not provided with the apertures 5', while a curve B' represents the light-exiting angle vs. light intensity in a case where the light-shielding layer 3' is provided with the apertures 5'. Comparing the curve A' and the curve B', it can be found that in the case where the light-shielding layer 3' is provided with the apertures 5', the amount of light that exits from the panel will significantly increase once the light-exiting angle reaches about 20°, resulting in stronger light intensity. In this case, it may result in significant color deviation of the panel at a large angle ranging from 20° to 90°, thereby greatly affecting a display performance thereof.

Figure 4:
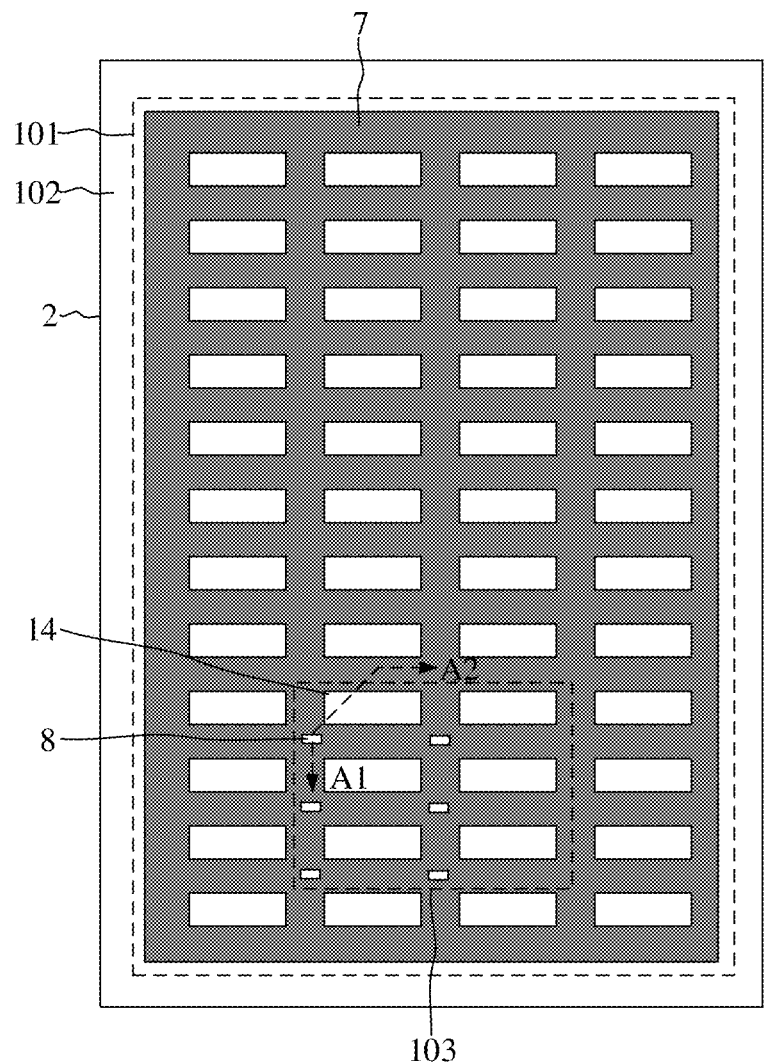
FIG. 4 is a top view of a display panel according to an embodiment of the present disclosure.
Figure 5:
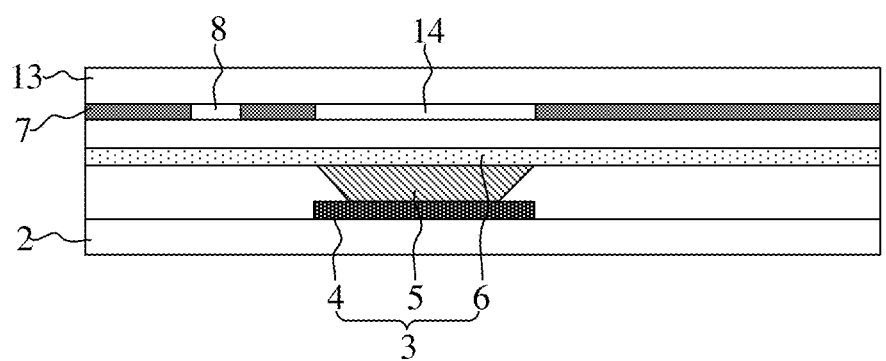
FIG. 5 is a cross-sectional view along A1-A2 direction shown in FIG. 4 according to an embodiment of the present disclosure.

In view of this, an embodiment of the present disclosure provides a display panel, as shown in FIG. 4 and FIG. 5. FIG. 4 is a top view of a display panel according to an embodiment of the present disclosure, and FIG. 5 is a cross-sectional view along A1-A2 direction shown in FIG. 4. The display panel has a display region 101 and a non-display region 102, and the display panel includes: a substrate 2; and a plurality of light-emitting elements 3 disposed at a side of the substrate 2 and located in the display region 101. Each light-emitting element 3 includes an anode 4, a light-emitting layer 5 and a cathode 6 that are stacked along a light-exiting direction of the display panel.

The display panel further includes a light-shielding layer 7. The light-shielding layer 7 is disposed at a side of the light-emitting elements 3 facing away from the substrate 2. The light-shielding layer 7 includes first apertures 8. In a direction perpendicular to a plane of the substrate 2, the first aperture 8 does not overlap with the light-emitting layer 5. It should be noted that, referring again to FIG. 4 and FIG. 5, the light-shielding layer 7 further includes openings 14, and the opening 14 overlaps with the light-emitting layer 5 in the direction perpendicular to the plane of the substrate 2. When the display panel displays an image, light emitted from the light-emitting layer 5 passes through the opening 14 to exit from the panel. When the display panel performs fingerprint recognition, light emitted from the light-emitting layer 5 is transmitted to a finger through the opening 14 and is then reflected by the finger, and the reflected light enters a fingerprint recognition module through the first aperture 8.

Figure 6:
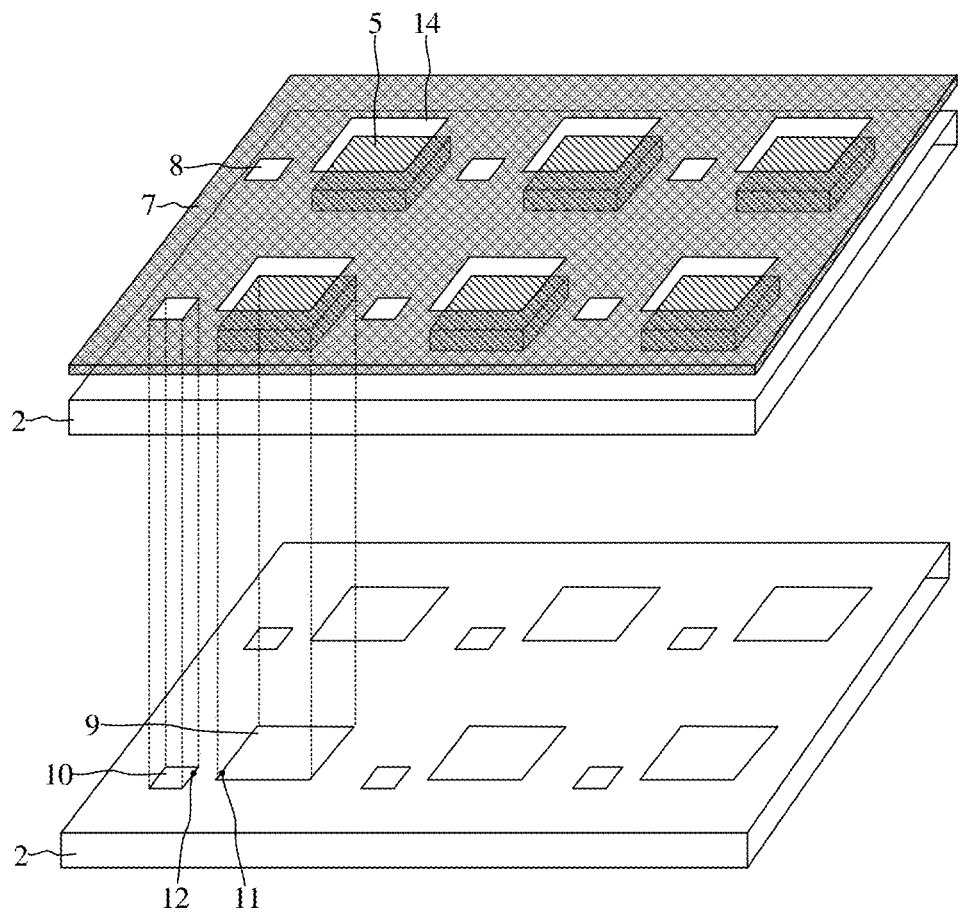
FIG. 6 is a schematic diagram illustrating a projection of the display panel according to an embodiment of the present disclosure.

FIG. 6 is a schematic diagram illustrating a projection of the display panel according to an embodiment of the present disclosure. As shown in FIG. 6, an orthographic projection of the light-emitting layer 5 on the substrate 2 is referred to as a first orthographic projection 9, and an orthographic projection of the first aperture 8 on the substrate 2 is referred to as a second orthographic projection 10. An edge of the first orthographic projection 9 includes a first point 11, and an edge of the second orthographic projection 10 includes a second point 12, then a distance between the first point 11 and the second point 12 is referred to as a distance between the first orthographic projection 9 and the second orthographic projection 10. For each first orthographic projection 9 that is adjacent to a second orthographic projection 10, the distance L between the second orthographic projection 10 and at least one first orthographic projection 9 satisfies:

$$L \geq \frac{d \times \sin\theta}{\sqrt{n^2 - \sin^2\theta}}$$

where d denotes a distance between the light-emitting layer 5 and the light-shielding layer 7, n denotes a refractive index of a functional film layer 13 of the display panel that is disposed at a side of the light-shielding layer 7 facing away from the substrate 2 (the functional film layer 13 may be a cover plate or a protective film, etc.,), and θ denotes a visible angle of the display panel (0°<θ<90°). It should be noted that, taking a vertical normal line of the panel screen as a reference, a user-approved image can be normally observed at a certain angle with respect to the normal line, then this certain angle is defined as a visible angle θ described above. For example, if the visible angle θ is 80°, a screen image can still be clearly observed at an observation position where an angle between the a viewing angle of the human eye and the normal line is 80°. Therefore, the visible angle defines a visible range of the user and defines the best viewing angle.

Figure 7:
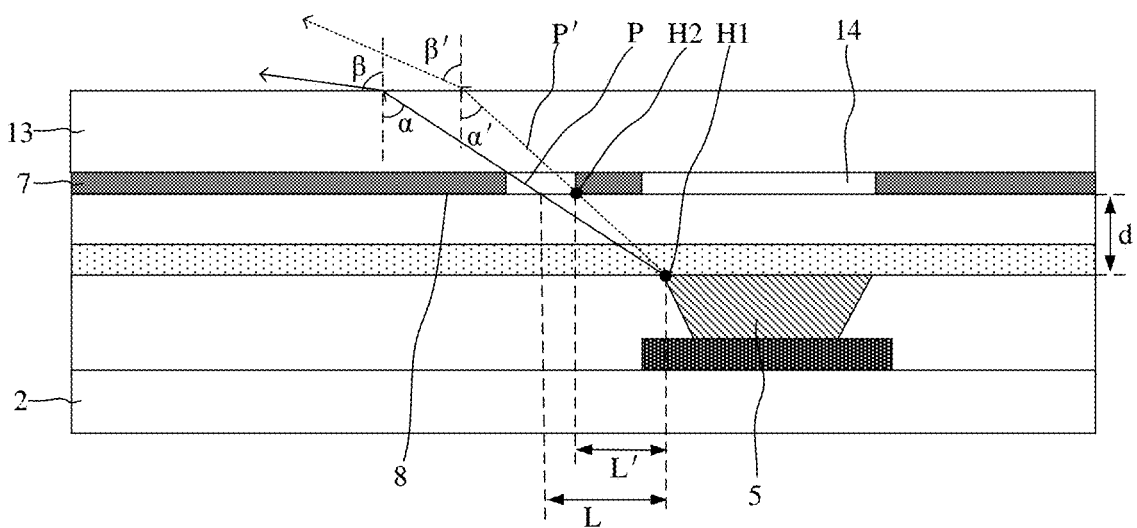
FIG. 7 is a schematic diagram illustrating light transmission according to an embodiment of the present disclosure.

Based on the structure described, as shown in FIG. 7, which is a schematic diagram illustrating light transmission according to an embodiment of the present disclosure, the light-emitting layer 5 includes a point H1, and an orthographic projection of the point H1 on the substrate 2 is referred to as a first point 11. Critical light emitted from the point H1 of the light-emitting layer 5 that can pass through the first aperture 8 is referred to as critical light P', and the critical light P' passes through a point H2 of the first aperture 8. A distance L' is formed between an orthographic projection of the point H2 on the substrate 2 and the first point 11, and L' is the minimum value of the distance L between the second point 12 and the first point 11, that is, L≥L'.

The critical light P' enters the functional film layer 13 at an incident angle α', and is then refracted at an interface between the functional film layer 13 and the air, the refraction angle is β'. According to a refraction formula sin β'=n×sin α', it can obtain that $$\tan\alpha' = \frac{\sin\beta'}{\sqrt{n^2 - \sin^2\beta'}}.$$

Furthermore, due to $$\tan\alpha' = \frac{L'}{d},$$

it can obtain by combining the two formulas that $$L' = \frac{d \times \sin\beta'}{\sqrt{n^2 - \sin^2\beta'}}.$$

For another part of light P emitted from the point H1 that can pass through the first aperture 8, this part of light will enter the functional film layer 13 at an incident angle a greater than α', and is then refracted at an interface between the functional film layer 13 and the air, the refraction angle is β. A refractive index of a film layer in the display panel is generally greater than a refractive index of the air (the refractive index of the air is 1), therefore, based on the normal line, light emitted from the light-emitting layer 5 is refracted at the interface between the functional film layer 13 and the air, the refraction angle shall be greater than the incident angle, and for the light that exits from a same interface, the greater the incident angle of the light, the larger the corresponding refraction angle of the light after being refracted. Therefore, when the incident angle α of the light P is greater than the incident angle α' of the critical light P', the refraction angle β corresponding to the light P will be greater than the refraction angle β' corresponding to the critical light P'.

Furthermore, when the refraction angle β' corresponding to the critical light P' is the visible angle θ, that is, $$L' = \frac{d \times \sin\theta}{\sqrt{n^2 - \sin^2\theta}},$$

each refraction angle of light that can pass through the first aperture 8 is greater than or equal to the visible angle θ. Even though this part of refracted light exits from the panel, it will only be transmitted outside the visible angle range and will not affect the amount of light within the visible angle range.

Therefore, in this embodiment of the present disclosure, by adjusting the distance between the first aperture 8 and the light-emitting layer 5, $$L \geq \frac{d \times \sin\theta}{\sqrt{n^2 - \sin^2\theta}},$$

then the light that exits from the panel after passing through the first aperture 8 can only be transmitted outside the visible angle range, and will not affect the amount of light within the visible angle range, thereby avoiding color deviation of this part of light in the visible angle, and thus improving the user's viewing experience.

In addition, users generally watch the screen within the visible angle range ranging from 30° to 70°, and for this reason, in conjunction with Table 1, the inventor selected seven angle values in the range ranging from 30° to 70° for simulation test. Taking 31° as an example, if the maximum angle for the panel having no color deviation is 31°, then a value of the distance L' obtained by simulation is 6 μm, while a value of the distance L' obtained according to the above-mentioned formula $$L' = \frac{d \times \sin\theta}{\sqrt{n^2 - \sin^2\theta}}$$

is 5.4 μm, this means that the two values are quite similar. Therefore, when the distance L between the second orthographic projection 10 and at least one first orthographic projection 9 adjacent thereto satisfies $$L \geq \frac{d \times \sin\theta}{\sqrt{n^2 - \sin^2\theta}},$$

it can effectively achieve that the value of L is greater than or equal to the value of the distance L' obtained according to simulation. Combined with the above analysis about the light P' and the light P', the technical scheme provided by the embodiments of the present disclosure can effectively alleviate color deviation in the visible angle.

TABLE 1

| Maximum angle with no color deviation (°) | Simulated L' (μm) | Calculated L' (μm) according to $L' = \frac{d \times \sin\theta}{\sqrt{n^2 - \sin^2-\theta}}$ |
|---|---|---|
| 31 | 6 | 5.4 |
| 37 | 7 | 6.6 |
| 44 | 8 | 7.9 |
| 49 | 9 | 8.8 |
| 54 | 10 | 9.6 |
| 60 | 11 | 10.6 |
| 69 | 12 | 11.9 |

After further research, it has been found that different distances L correspond to different values of the visible angle at which the panel has color deviation. Combined with the above analysis about FIG. 7, the larger the distance L between the second orthographic projection 10 and the first orthographic projection 9 is, the more the light that exits from the first aperture 8 is inclined toward a direction closer to the substrate 2. In this case, the incident angle α of the light is larger, and accordingly, the refraction angle β is larger accordingly, so the visible angle at which the panel has no color deviation is also larger.

The present disclosure provides simulation tests for three cases, including: no first aperture 8 being formed in the light-shielding layer 7; the first aperture 8 being formed in the light-shielding layer 7, and the distance between the first orthographic projection 9 and the second orthographic projection 10 being 26 μm; and the first aperture 8 being formed in the light-shielding layer 7, and the distance between the first orthographic projection 9 and the second orthographic projection 10 being 23 μm.

It can be understood that the light-emitting element 3 emits more light in the direction perpendicular to the substrate 2. Therefore, referring to a diagram of an overall distribution of light-exiting angles and light intensities shown in FIG. 8, the light brightness at a front viewing angle is greater than the light brightness at a large viewing angle. In the above-mentioned three cases, although the overall distribution of the light-exiting angles and the light intensities are roughly the distribution shown in FIG. 8, there are still certain differences in the light intensity at different light-exiting angles.

Figure 8:
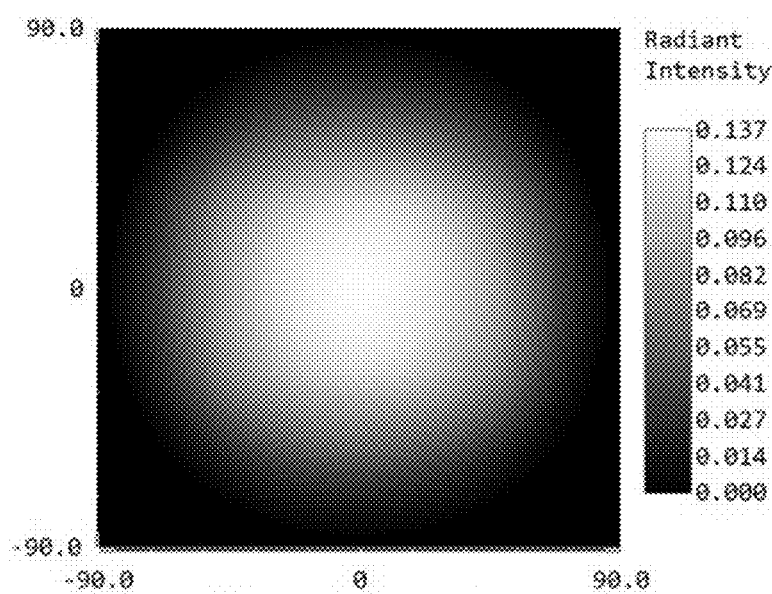
FIG. 8 is schematic diagram illustrating a distribution of light-exiting angle and light intensity according to an embodiment of the present disclosure.
Figure 9:
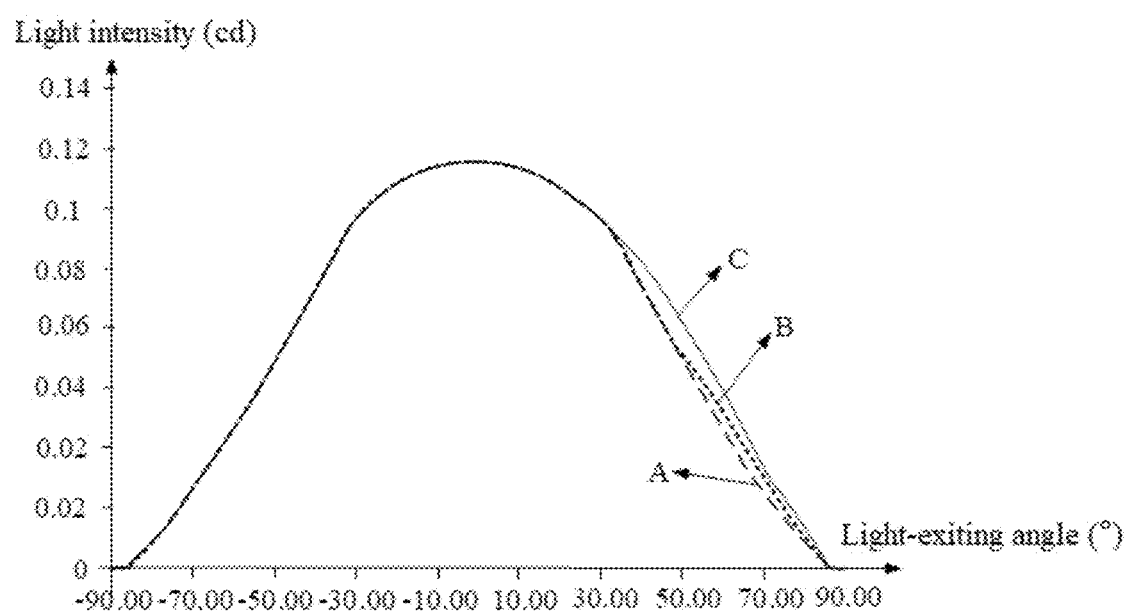
FIG. 9 shows a schematic curve simulation diagram of light-exiting angle vs. light intensity according to an embodiment of the present disclosure.

Further, as shown in FIG. 9, which shows a schematic curve simulation diagram of light-exiting angles vs. light intensities according to an embodiment of the present disclosure, three curves A, B and C correspond to three cases. These include a curve A obtained from a plurality of data points in the distribution as shown in FIG. 8 and corresponding to a case that no first aperture 8 is formed in the light-shielding layer 7; a curve B obtained from a plurality of data points in the distribution as shown in FIG. 8 and corresponding to a case that the first aperture 8 is formed in the light-shielding layer 7 and the distance between the first orthographic projection 9 and the second orthographic projection 10 is 26 μm; and a curve C obtained from a plurality of data points in the distribution as shown in FIG. 8 and corresponding to a case that the first aperture 8 is formed in the light-shielding layer 7 and the distance between the first orthographic projection 9 and the second orthographic projection 10 is 23 μm.

For the curve C, the distance L is smaller, the light that exits from the first aperture 8 is more inclined toward a direction closer to the normal line, the incident angle of the light is smaller when the light enters the functional film layer 13, and the refraction angle is smaller, therefore, the refraction angle of the refracted light, that is, the light-exiting angle is smaller. Starting from the light-exiting angle 30°, the light intensity of the curve C will be different from the light intensity of the curve A. In this case, the minimum viewing angle for the panel having no color deviation is 30°, and the panel will have color deviation in the viewing angle range ranging from 30° to 90°.

For the curve B, the distance L is larger, the light that exists from the first aperture 8 is more inclined toward a direction closer to the substrate 2, and the light deviates from the normal line to a greater extent, making the incident angle of the light be larger when the light enters the functional film layer 13. In this case, the light intensity of the curve B will be different from the light intensity of the curve A starting from the light-exiting angle 50°. Therefore, the minimum viewing angle for the panel having no color deviation is increased to 50°, and the panel will have color deviation only in the viewing angle range ranging from 50° to 90°.

Based on the above analysis, in this embodiment of the present disclosure, the distance L between the second orthographic projection 10 and the first orthographic projection 9 can be designed according to the requirements on the minimum viewing angle for the panel having no color deviation.

In addition, it should be noted that the visible angle θ defined in this embodiment of the present disclosure refers to an angle formed between the normal line and the circumferential direction, and the angle has no difference in terms of direction. For example, the visible angle 45° refers to an angle 45° formed between the normal line and a direction at a side of the normal line. The light-exiting angles ranging from −90° to 90° shown in the abscissa of FIG. 9 can be understood as the light-exiting directions at different sides of the normal line, that is, the angles ranging from −90° to 0° and the angles ranging from 0° to 90° refer to ranges of the light-exiting angles at two sides of the normal line. As shown in FIG. 4 to FIG. 7, the first aperture 8 is only located at one side of the light-emitting layer 5, thus, light emitted from the light-emitting layer 5 can exit only from the first aperture 8 at one side; therefore, there is color deviation influence only within the range of light-exiting angles from 0° to 90°, and there is no color deviation influence within the range of light-exiting angles from −90° to 0°.

In addition, it should be noted that the entire area of the display region 101 may be reused as a fingerprint recognition area, and, in this case, the first apertures 8 are dispersedly distributed in the entire display region 101. Alternatively, referring to FIG. 4 again, a part of the display region 101 may be reused as a fingerprint recognition area 103, in this case, the first apertures 8 may be located only in the fingerprint recognition area 103, so as to prevent the first aperture 8 from affecting the light emitted from the display region other than the fingerprint recognition area 103.

Figure 10:
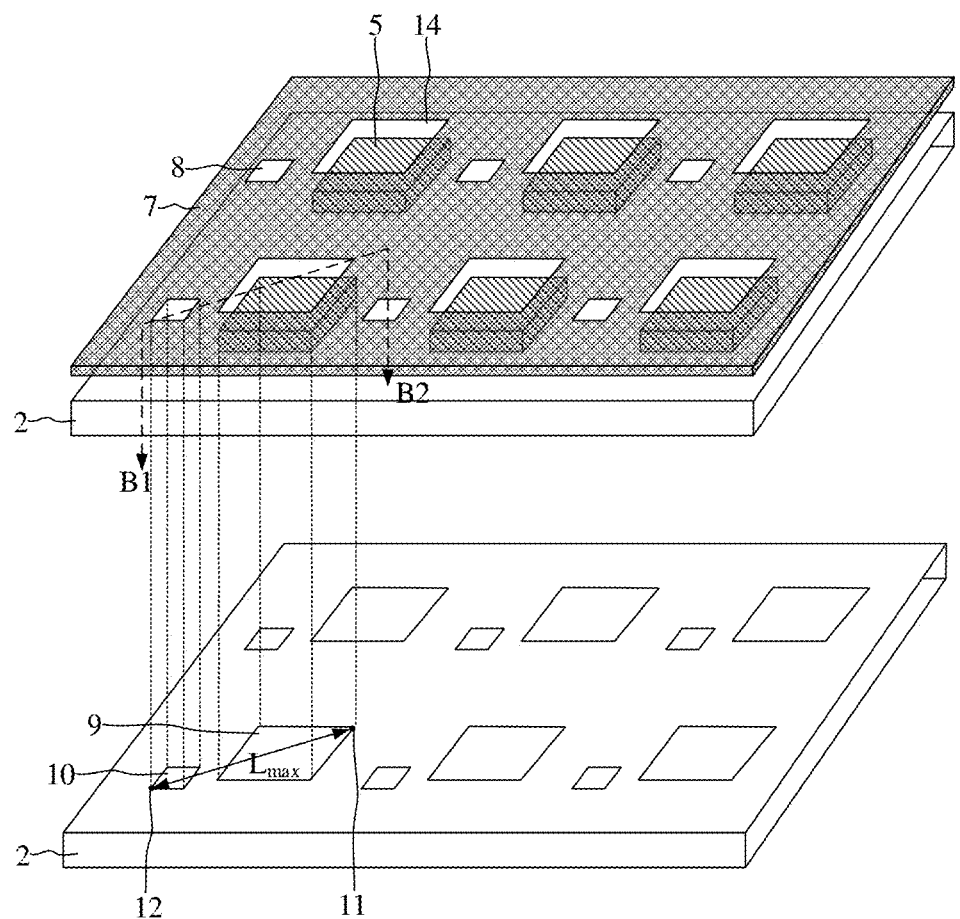
FIG. 10 is a schematic diagram illustrating a maximum distance between a first orthographic projection and a second orthographic projection according to an embodiment of the present disclosure.
Figure 11:
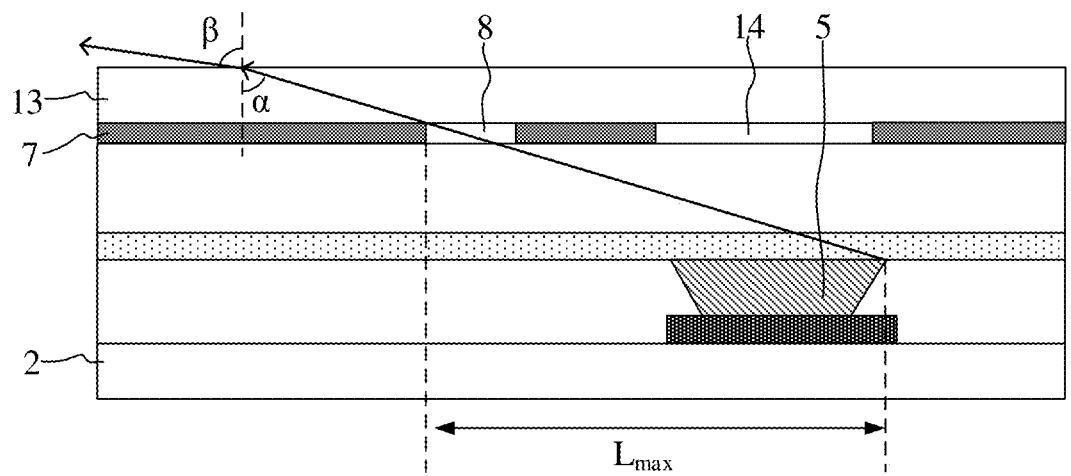
FIG. 11 is a cross-sectional view along B1-B2 direction shown in FIG. 10 according to an embodiment of the present disclosure.

FIG. 10 is a schematic diagram illustrating a maximum distance between the first orthographic projection 9 and the second orthographic projection 10 according to an embodiment of the present disclosure, and FIG. 11 is a cross-sectional view along B1-B2 direction shown in FIG. 10. In an embodiment, as shown in FIG. 10 and FIG. 11, the maximum distance between the first point 11 and the second point 12 is the maximum distance between the first orthographic projection 9 and the second orthographic projection 10. The maximum distance $L_{max}$ between the orthographic projection 10 and at least one first orthographic projection 9 adjacent to the orthographic projection 10 satisfies:

$$L_{max} \geq \frac{d \times \sin\theta}{\sqrt{n^2 - \sin^2\theta}}.$$

With this configuration, after a part of the large-angle light emitted from the light-emitting layer 5 exits from the first aperture 8, the refraction angle β is greater than the visible angle θ. After this part of light exits from the panel, it will only be transmitted outside the visible angle range and will not affect the amount of light in the visible angle. In this way, color deviation in the visible angle can be effectively alleviated to a certain extent.

Figure 12:
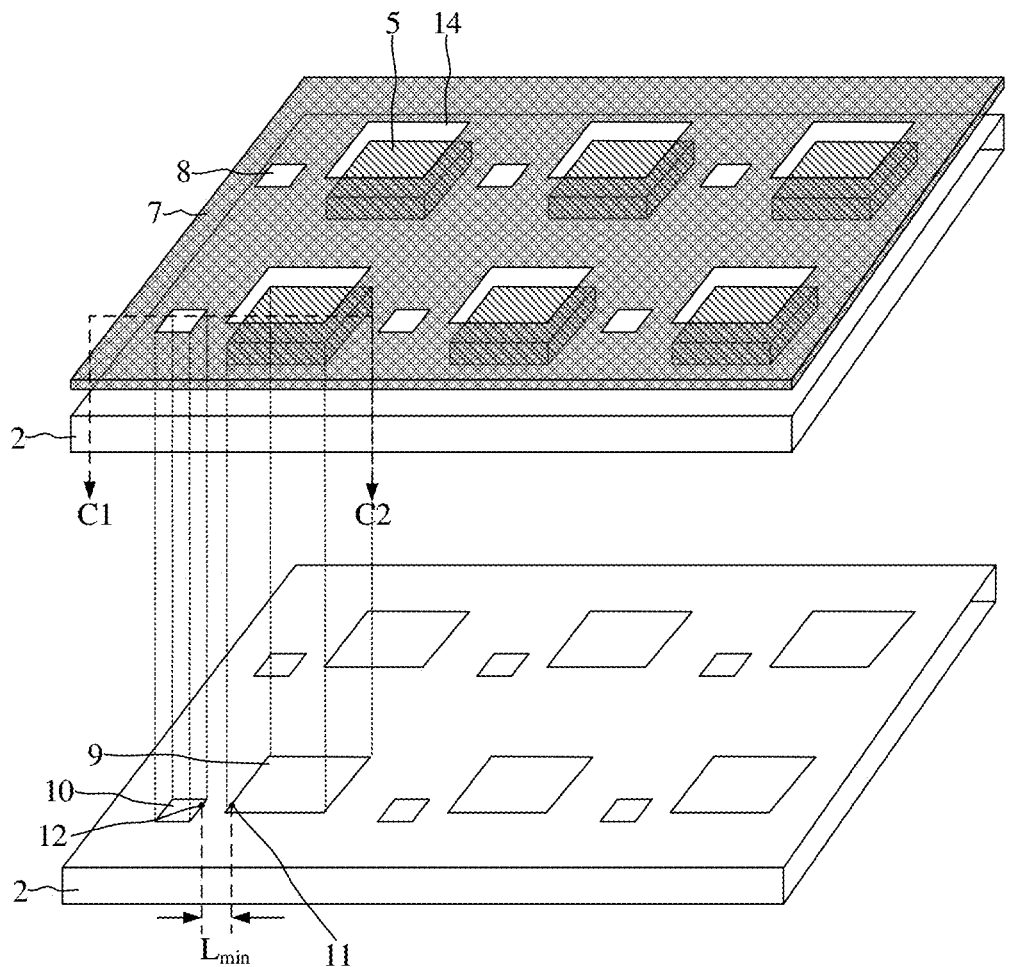
FIG. 12 is a schematic diagram illustrating a minimum distance between the first orthographic projection and the second orthographic projection according to an embodiment of the present disclosure.
Figure 13:
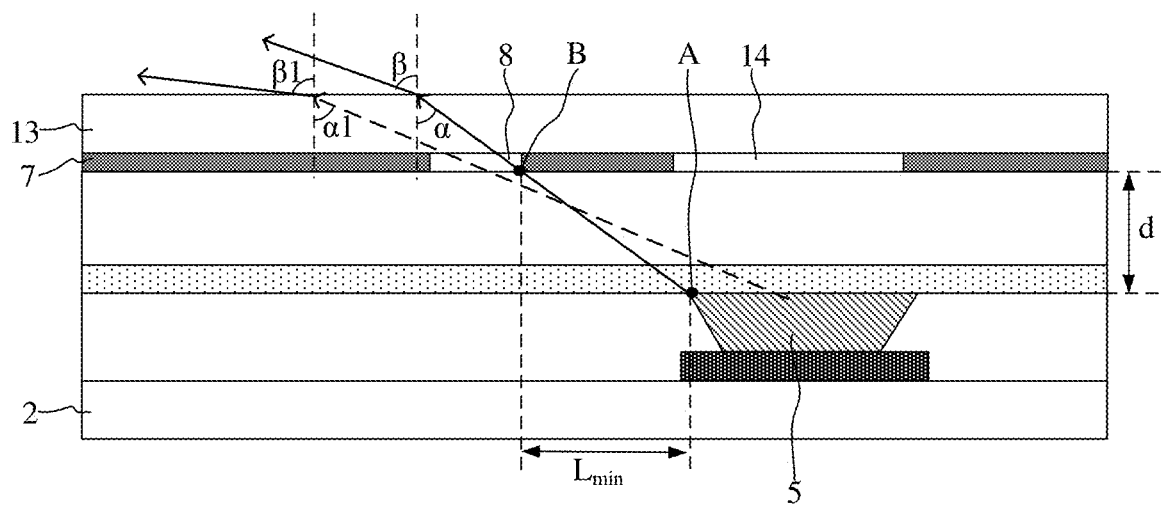
FIG. 13 is a cross-sectional view along C1-C2 direction shown in FIG. 12 according to an embodiment of the present disclosure.

FIG. 12 is a schematic diagram illustrating a minimum distance between the first orthographic projection 9 and the second orthographic projection 10 according to an embodiment of the present disclosure, and FIG. 13 is a cross-sectional view along C1-C2 direction shown in FIG. 12. In an embodiment, as shown in FIG. 12 and FIG. 13, the minimum distance between the first point 11 and the second point 12 is the minimum distance between the first orthographic projection 9 and the second orthographic projection 10. The minimum distance $L_{min}$ between the second orthographic projection 10 and at least one first orthographic projection 9 adjacent to the second orthographic projection 10 satisfies $$L_{min} \geq \frac{d \times \sin\theta}{\sqrt{n^2 - \sin^2\theta}}.$$

Referring to FIG. 13 again, in a case that the minimum distance $L_{min}$ satisfies:

$$L_{min} \geq \frac{d \times \sin\theta}{\sqrt{n^2 - \sin^2\theta}},$$

when light emitted from the point A of the light-emitting layer 5 exits from the panel after passing through the point B of the aperture 8, the refraction angle β is greater than or equal to the visible angle θ. In this case, the orthographic projections of the point A and the point B on the substrate 2 corresponding to the first point 11 and the second point 12, respectively. In addition, when light emitted from any other point of the light-emitting layer 5 exits from the panel after passing through the first aperture 8, any incident angle α1 will be greater than the incident angle α, and accordingly, any refraction angle β1 corresponding to this part of light will be greater than the refraction angle β (i.e., greater than the visible angle θ). As a result, it may be achieved that the light emitted from any position of the light-emitting layer 5 will not be transmitted within the visible angle range after it exits from the panel after passing through the first aperture 8, and thus will not affect the amount of light emitted in the visible angle. In this way, color deviation in the visible angle can be alleviated to a greater extent.

Further, so that the light that exits from the first aperture 8 is transmitted outside the visible angle range, the minimum distance $L_{min}$ between the second orthographic projection 10 and the first orthographic projection 9 adjacent to the second orthographic projection 10 shall satisfy:

$$L_{min} \geq \frac{d \times \sin\theta}{\sqrt{n^2 - \sin^2\theta}}.$$

Figure 14:
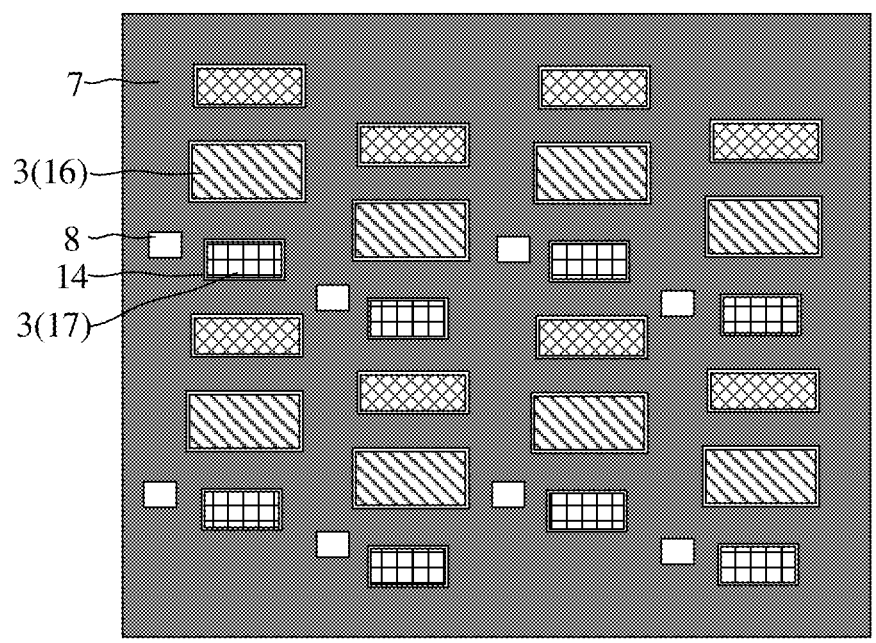
FIG. 14 is another top view of a display panel according to an embodiment of the present disclosure.
Figure 15:
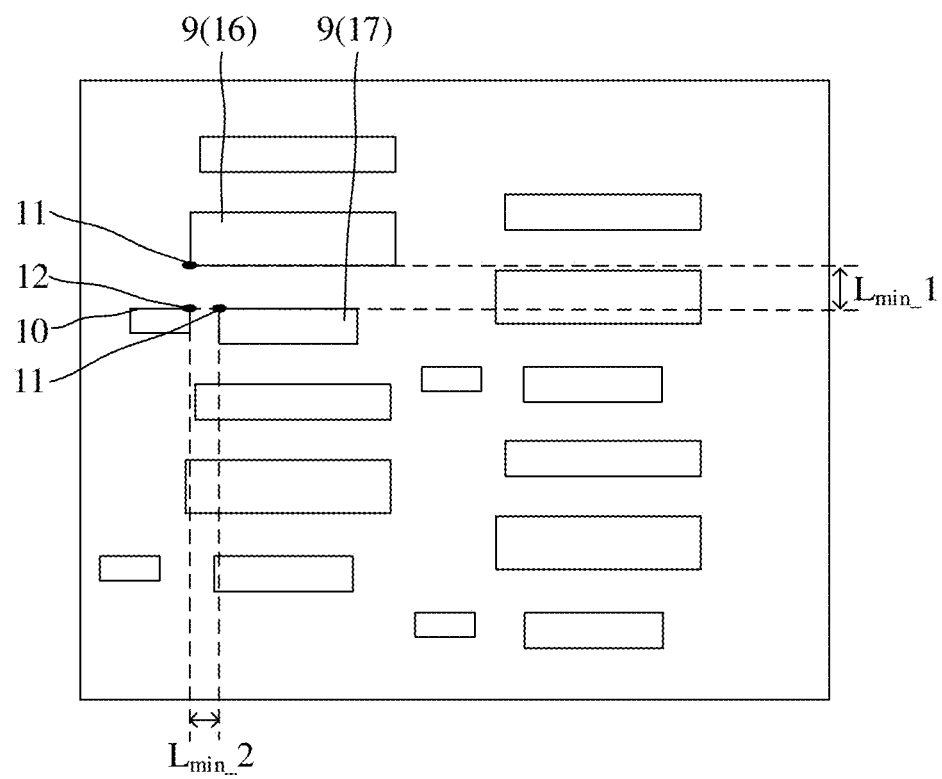
FIG. 15 is a schematic diagram illustrating the first orthographic projection and the second orthographic projection corresponding to FIG. 14 according to an embodiment of the present disclosure.

FIG. 14 is another top view of a display panel according to an embodiment of the present disclosure, and FIG. 15 is a schematic diagram illustrating first orthographic projections 9 and second orthographic projections 10 corresponding to FIG. 14. In an embodiment, as shown in FIG. 14 and FIG. 15, the light-emitting elements 3 include a first light-emitting element 16 and a second light-emitting element 17, and a light-emitting efficiency of the first light-emitting element 16 is greater than a light-emitting efficiency of the second light-emitting element 17. The minimum distance $L_{min\_}1$ between the second orthographic projection 10 and the first orthographic projection 9 of the first light-emitting element 16 adjacent to the second orthographic projection 10 satisfies:

$$L_{min\_}1 \geq \frac{d \times \sin\theta}{\sqrt{n^2 - \sin^2\theta}},$$

and the minimum distance $L_{min\_}2$ between the second orthographic projection 10 and the first orthographic projection 9 of the second light-emitting element 17 adjacent to the second orthographic projection 10 satisfies:

$$L_{min\_2} \geq \frac{d \times \sin\theta}{\sqrt{n^2 - \sin^2\theta}}.$$

Since the light-emitting efficiency of the first light-emitting element 16 is greater, the light emitted from the first light-emitting element 16 accounts for a large proportion, and this part of light is more likely to cause obvious color deviation. The minimum distance $L_{min\_1}$ is greater than or equal to $$\frac{d \times \sin\theta}{\sqrt{n^2 - \sin^2\theta}},$$

so that even if the light emitted from the first light-emitting element 16 exits from the panel after passing through the first aperture 8, the light will be transmitted only outside the visible angle range, thereby reducing the possibility of color deviation caused by this part of light. Since the light-emitting efficiency of the second light-emitting element 17 is smaller, the light emitted from the second light-emitting element 17 accounts for a small proportion, and this part of light is less likely to cause obvious color deviation. In this case, the minimum distance $L_{min\_2}$ may be set to be smaller than $$\frac{d \times \sin\theta}{\sqrt{n^2 - \sin^2\theta}},$$

the first aperture 8 and the second light-emitting element 17 may be configured to be closer to each other, so that in the layout design, the first aperture 8 and the opening 14 corresponding to the second light-emitting element 17 can be arranged more compactly, which is more suitable for the layout design of a high-resolution panel.

In an embodiment, $$L \geq \frac{d \times \sin 30°}{\sqrt{n^2 - \sin^2 30°}},$$

in this case, the maximum viewing angle of the panel with no color deviation is 30°.

For a display panel having a higher resolution, the arrangement of light-emitting elements 3 in the panel is dense, correspondingly, the arrangement of openings 14 in light-shielding layer 7 will also be dense. Therefore, there will be a smaller space of the light-shielding layer 7 for arranging the first apertures 8. In a case of $$L \geq \frac{d \times \sin 30°}{\sqrt{n^2 - \sin^2 30°}},$$

under the aim of alleviating color deviation at certain viewing angles, the distance between the first orthographic projection 9 and the second orthographic projection 10 is small. Correspondingly, the distance between the first aperture 8 and the opening 14 in the light-shielding layer 7 is also small, thereby facilitating matching with the high-resolution panel structure.

In addition, based on the above-mentioned configuration, when viewing the screen at a viewing angle greater than 30°, the color deviation caused by the first aperture 8 can also allow the screen of the panel have a privacy protection function. In this way, an image displayed on the screen can be seen only by the user who is watching at a front angle, thereby effectively protecting the user's privacy. Therefore, this configuration is more suitable for the panel design for the user to view the screen at a front angle.

Alternatively, in another embodiment, $$L \geq \frac{d \times \sin 70°}{\sqrt{n^2 - \sin^2 70°}},$$

in this case, the maximum viewing angle for the panel having no color deviation is 70°.

Based on the above-mentioned configuration, the viewing angle range is large for the panel having no color deviation. The panel will have color deviation only when the viewing angle is close to 90°, and the panel has no color deviation in the viewing angle range ranging from 0° to 70°, which is enough to meet the user's needs for daily use. Therefore, based on this configuration, an influence of color deviation on the user's viewing experience can be significantly reduced. Moreover, it should be noted that in a case of $$L \geq \frac{d \times \sin 70°}{\sqrt{n^2 - \sin^2 70°}},$$

the distance between the first orthographic projection 9 and the second orthographic projection 10 is slightly larger. Correspondingly, the distance between the first aperture 8 and opening 14 in the light-shielding layer 7 is larger, and such a design is more suitable for a low-resolution panel structure.

Alternatively, since the user's regular viewing angle when viewing the screen is within a range from 0° to 60°, L can be set to satisfy:

$$L \geq \frac{d \times \sin 60°}{\sqrt{n^2 - \sin^2 60°}},$$

in which case the maximum viewing angle for the panel having no color deviation is 60°.

Figure 16:
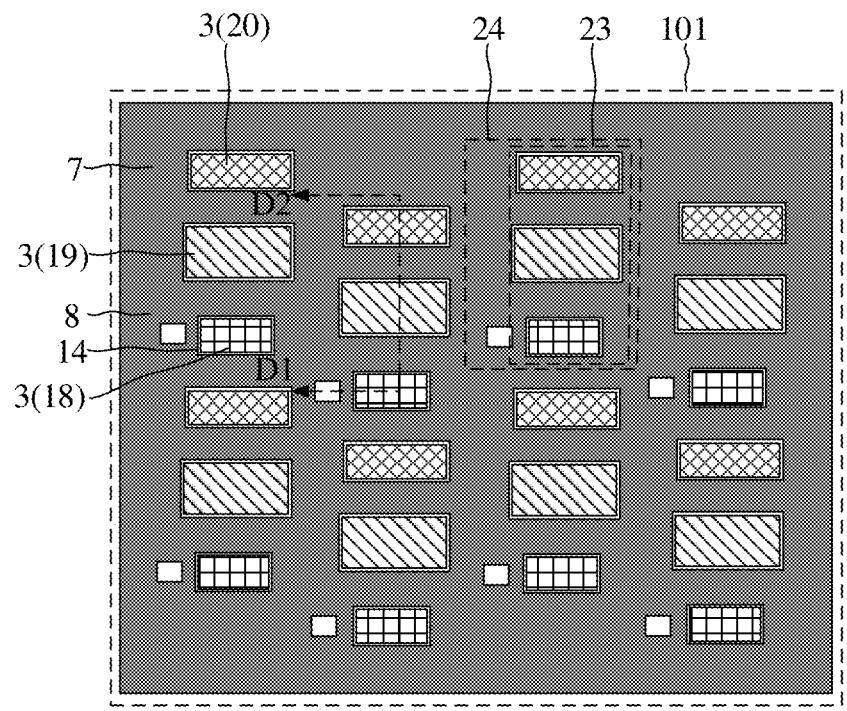
FIG. 16 is another top view of a display panel according to an embodiment of the present disclosure.
Figure 17:
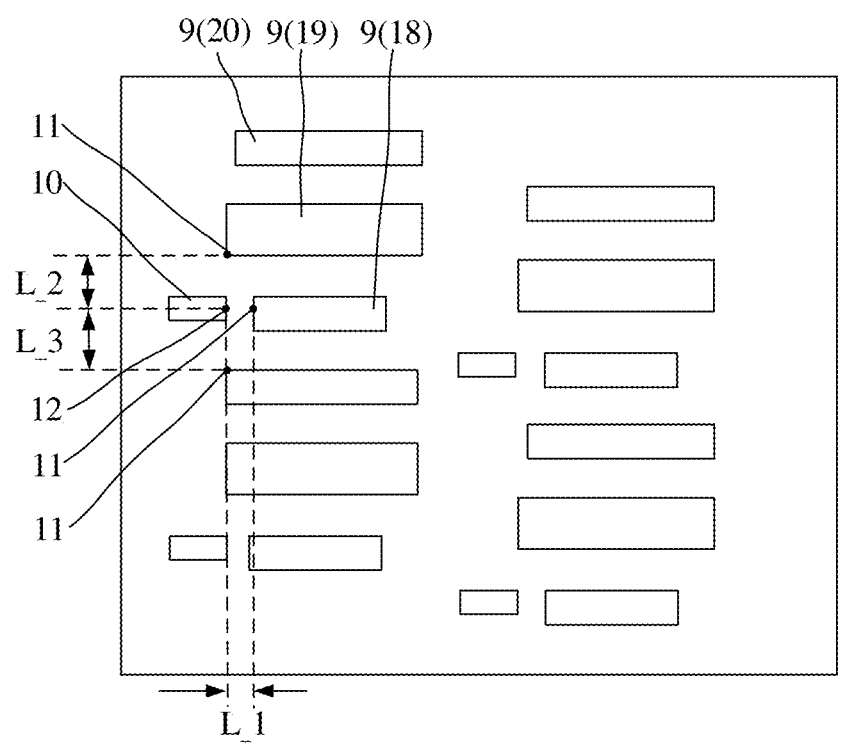
FIG. 17 is a schematic diagram illustrating the first orthographic projection and the second orthographic projections corresponding to FIG. 16 according to an embodiment of the present disclosure.
Figure 18:
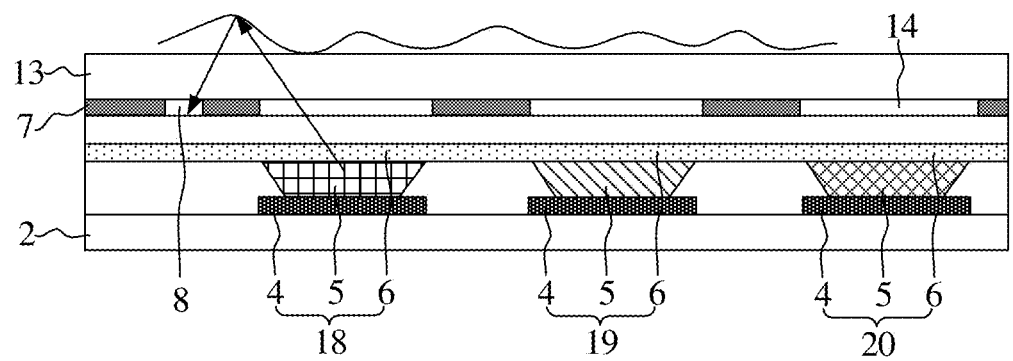
FIG. 18 is a cross-sectional view along D1-D2 direction shown in FIG. 16 according to an embodiment of the present disclosure.

FIG. 16 is another top view of a display panel according to an embodiment of the present disclosure, FIG. 17 is a schematic diagram illustrating first orthographic projections 9 and second orthographic projections 10 corresponding to FIG. 16, and FIG. 18 is a cross-sectional view along D1-D2 direction shown in FIG. 16. In an embodiment, as shown in FIG. 16 to FIG. 18, the light-emitting elements 3 include a first color light-emitting element 18 configured to emit a first color light, and a second color light-emitting element 19 configured to emit a second color light, and a third color light-emitting element 20 configured to emit a third color light. The first color light is detection light for fingerprint recognition. The distance between the second orthographic projection 10 and the first orthographic projection 9 of the first color light-emitting element 18 adjacent to the second orthographic projection 10 is L_1, the distance between the second orthographic projection 10 and the first orthographic projection 9 of the second color light-emitting element 19 adjacent to the second orthographic projection 10 is L_2, and the distance between the second orthographic projection 10 and the first orthographic projection 9 of the third color light-emitting element 20 adjacent to the second orthographic projection 10 is L_3, where L_1<L_2 and L_1<L_3.

Based on the above-mentioned configuration, the first aperture 8 is closer to the first color light-emitting element 18, and after the first color light emitted from the first color light-emitting element 18 is reflected by the finger, it will be easier for the light to enter the finger fingerprint recognition module through the first aperture 8, thereby, increasing the amount of detection light that enters the fingerprint recognition module and, thus, improving the fingerprint recognition accuracy.

Further, in an embodiment, the first color is green, that is, the green light-emitting element in the panel is configured for and suitable for use as a light source for fingerprint recognition. Moreover, the minimum distance between the first point 11 and the second point 12 is the minimum distance between the first orthographic projection 9 and the second orthographic projection 10, and the minimum distance $L_{min\_}11$ between the second orthographic projection 10 and the first orthographic projection 9 of the first color light-emitting element 18 adjacent to the second orthographic projection 10 satisfies:

$$L_{min\_}11 \geq \frac{d \times \sin\theta}{\sqrt{n^2 - \sin^2\theta}}.$$

The shorter the wavelength is, the more likely light scattering occurs, and the weaker penetration to the skin is. Therefore, the finger has higher reflectivity to green light, and the fingerprint recognition module has greater capability of recognizing green light, then using green light as detection light can result in higher fingerprint recognition accuracy. Moreover, optical nerves of the human eye have different sensitivity to light of different wavelengths. In this regard, even if light of different wavelengths has a same radiant power, the human eye will perceive different radiant powers. Besides, the human eye is most sensitive to light of a wavelength about 550 nm, that is, green light, which can optimize the brain's perception of contrast. Therefore, if green light generates color deviation, it is most easily perceivable by the human eye. For this reason, in an embodiment, $L_{min\_}11$ is set to satisfy $$L_{min\_}11 \geq \frac{d \times \sin\theta}{\sqrt{n^2 - \sin^2\theta}},$$

so that it can achieve that the light emitted from any position of the light-emitting layer 5 of the green light-emitting element will not be transmitted within the visible angle range after it exits from the panel after passing through the first aperture 8. Thus, it will not affect the amount of green light emitted in the visible angle, thereby avoiding color deviation caused by green light and thus allowing the panel to have excellent characteristics, such as high recognition accuracy and low color deviation.

Alternatively, in an embodiment, the first color is blue, that is, the blue light-emitting element in the panel is used as a light source for fingerprint recognition. Moreover, the maximum distance between the first point 11 and the second point 12 is the maximum distance between the first orthographic projection 9 and the second orthographic projection 10, and the maximum distance $L_{max\_}1$ between the second orthographic projection 10 and the first orthographic projection 9 of the first color light-emitting element 18 adjacent to the second orthographic projection 10 satisfies $$L_{max\_}1 \geq \frac{d \times \sin\theta}{\sqrt{n^2 - \sin^2\theta}};$$

and the minimum distance between the first point 11 and the second point 12 is the minimum distance between the first orthographic projection 9 and the second orthographic projection 10, and the minimum distance $L_{min\_}12$ between the second orthographic projection 10 and the first orthographic projection 9 of the first color light-emitting element 18 adjacent to the second orthographic projection 10 satisfies $$L_{min\_}12 < \frac{d \times \sin\theta}{\sqrt{n^2 - \sin^2\theta}}.$$

The blue light-emitting element 3 has relatively low light-emitting brightness, therefore, using blue light for fingerprint detection can avoid the problem that recognition capability of the fingerprint recognition module is decreased due to excessive brightness, which would result in decreased fingerprint recognition accuracy.

In addition, since blue light has great power, some chemical bonds may be broken in an excited state, which may cause the material of the blue light-emitting layer to be fissile, resulting in a short service life of the blue light-emitting element. For this reason, in the existing structure design of a display panel, an aperture ratio of the blue light-emitting element is usually set to be larger, and the service life of the blue light-emitting element is increased by reducing the current density. Therefore, compared with light-emitting elements of other colors, the light-emitting layer 5 of the blue light-emitting element has a larger area. For the first aperture 8 that has a constant dimension, a ratio of an area of the first aperture 8 to the area of the light-emitting layer 5 of the blue light-emitting element is smaller, so an influence of blue light on color deviation is smaller than an influence of light of other colors on color deviation. For this reason, the maximum distance $L_{max\_}1$ can be set to be greater than or equal to $$\frac{d \times \sin\theta}{\sqrt{n^2 - \sin^2\theta}},$$

and the minimum distance $L_{min\_}12$ can be set to be smaller than $$\frac{d \times \sin\theta}{\sqrt{n^2 - \sin^2\theta}}.$$

In this way, under the premise that a part of blue light that emits from the panel after passing through the first aperture 8 is transmitted outside the visible angle range, the minimum difference between the first aperture 8 and the first color light-emitting element 18 is reduced. In this regard, the arrangement of the openings 14 corresponding to the first color light-emitting elements 18 and the first apertures 8 in the light-shielding layer 7 can be more compact, which is more suitable for the layout design of a high-resolution display panel.

Figure 19:
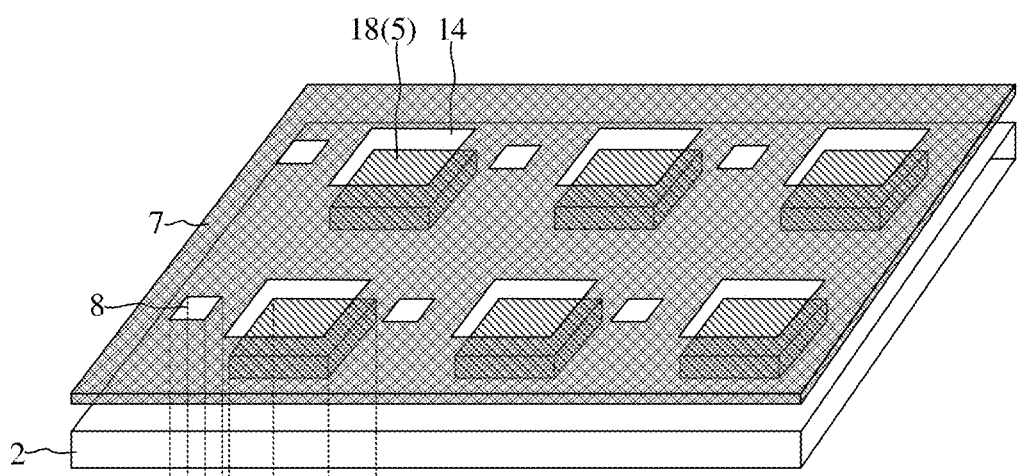
FIG. 19 is a schematic diagram illustrating another projection of a display panel according to an embodiment of the present disclosure.

FIG. 19 is a schematic diagram illustrating another projection of a display panel according to an embodiment of the present disclosure. As shown, the first orthographic projection 9 of the first color light-emitting element 18 has a same distance to each of a plurality of second orthographic projections 10 adjacent to the first orthographic projection 9. With this configuration, when the light emitted from the first color light-emitting element 18 exits from multiple first apertures 8 adjacent to the first color light-emitting element 18, the light intensities at different light-exiting angles can have improved consistency, and thus particularly serious color deviation at a certain angle can be avoided.

Figure 20:
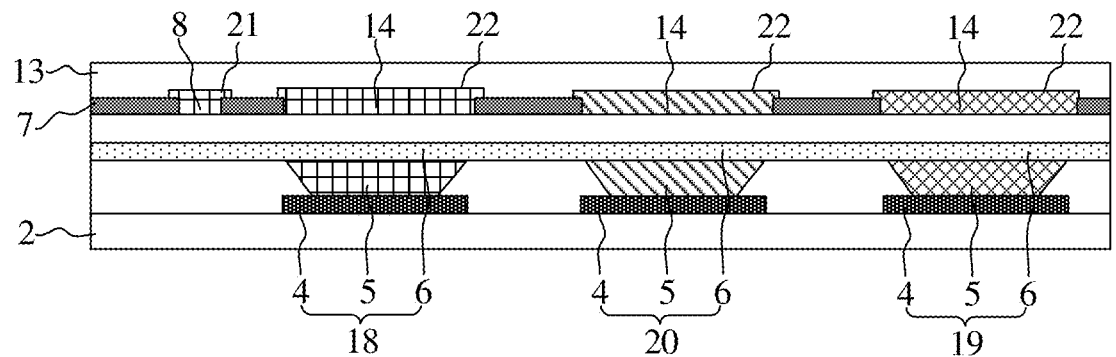
FIG. 20 is a structural schematic diagram of a first color filter block according to an embodiment of the present disclosure.

In an embodiment, as shown in FIG. 20, which is a structural schematic diagram of a first color filter block 21 according to an embodiment of the present disclosure, the display panel further includes a first color filter block 21 provided at a side of the light-emitting element 3 facing away from the substrate 2. A color of the first color filter block 21 is the first color. In a direction perpendicular to the plane of the substrate 2, the first color filter block 21 overlaps with the first aperture 8.

In an aspect, when the first color light is the detection light for fingerprint recognition, by providing the color filter block of the first color at the first aperture 8, the light of other colors reflected by the finger can be filtered, thereby preventing light of other colors from entering the fingerprint recognition module through the first aperture 8 to interfere with fingerprint recognition; in another aspect, even if the second color light emitted from the second color light-emitting element 19 and the third color light emitted from the third color light-emitting element 20 are transmitted to the first aperture 8, this part of light cannot exit from the first color filter block 21, thereby further avoiding color deviation caused by an increased amount of light of the second color and of the third color in the visible angle; in still another aspect, by providing the first color filter block 21, ambient light of other colors can be filtered, thereby reducing an interference of ambient light on fingerprint recognition.

In addition, it should be noted that, in order to achieve normal display of the panel, the display panel further includes a second color filter block 22. In the direction perpendicular to the plane of the substrate 2, the second color filter block 22 overlaps with the opening 14, and the color of the second color filter block 22 is the same as the color of the light emitted from the light-emitting layer 5 that overlaps with the second color filter block 22.

Figure 21:
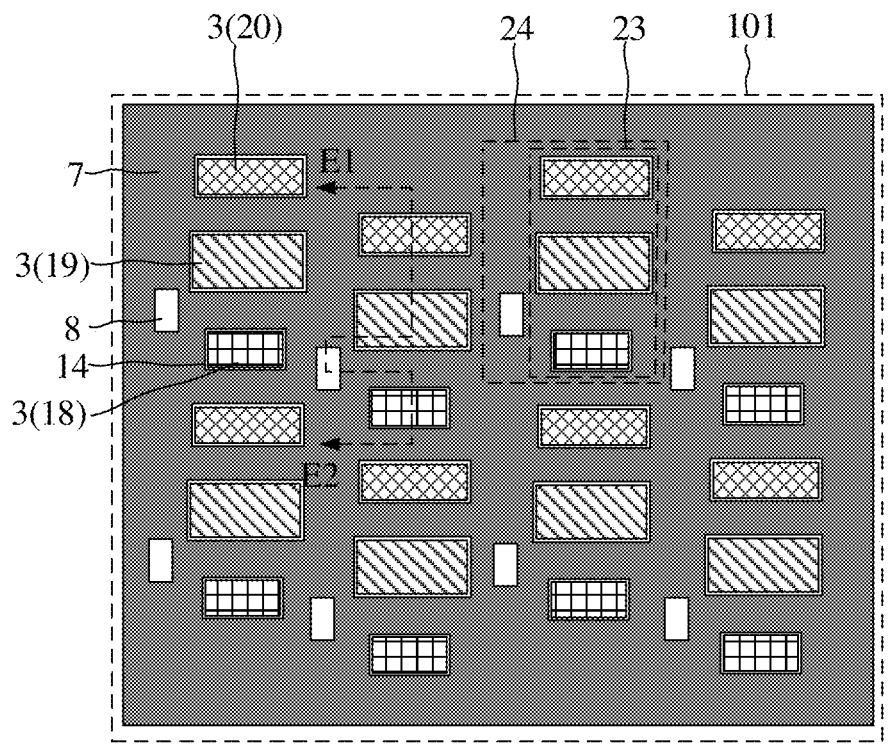
FIG. 21 is another top view of a display panel according to an embodiment of the present disclosure.
Figure 22:
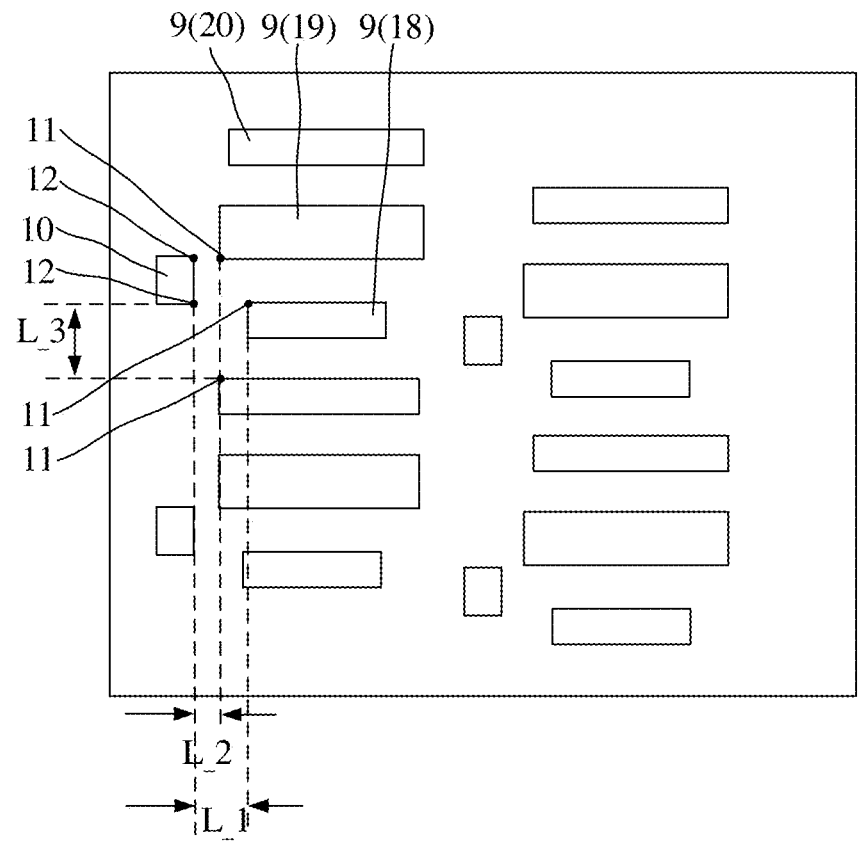
FIG. 22 is a schematic diagram illustrating the first orthographic projection and the second orthographic projection corresponding to FIG. 21 according to an embodiment of the present disclosure.
Figure 23:
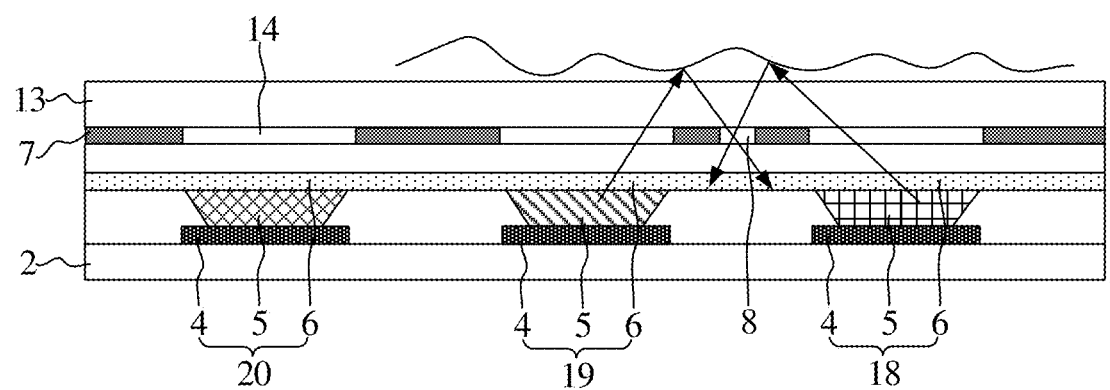
FIG. 23 is a cross-sectional view along E1-E2 direction shown in FIG. 21 according to an embodiment of the present disclosure.

FIG. 21 is another top view of a display panel according to an embodiment of the present disclosure, FIG. 22 is a schematic diagram illustrating first orthographic projections 9 and second orthographic projections 10 corresponding to FIG. 21, and FIG. 23 is a cross-sectional view along E1-E2 direction shown in FIG. 21. In an embodiment, as shown in FIGS. 21 to FIG. 23, the light-emitting element 3 includes a first color light-emitting element 18 for emitting a first color light, a second color light-emitting element 19 for emitting a second color light, and a third color light-emitting element 20 for emitting a third color light. The first color light and the second color light are detection light configured and suitable fingerprint recognition. In an embodiment, the first color is green, and the second color is blue. That is, the green light-emitting element and the blue light-emitting element in the panel are used as light sources for fingerprint recognition.

The distance between the second orthographic projection 10 and the first orthographic projection 9 of the first color light-emitting element 18 adjacent to the second orthographic projection 10 is $L\_1'$, the distance between the second orthographic projection 10 and the first orthographic projection 9 of the second color light-emitting element 19 adjacent to the second orthographic projection 10 is $L\_2'$, and the distance between the second orthographic projection 10 and the first orthographic projection 9 of the third color light-emitting element 20 adjacent to the second orthographic projection 10 is $L\_3'$, where $L\_2'<L\_1'<L\_3'$.

By making $L\_1'$, $L\_2'$, and $L\_3'$ satisfy the above relationship, compared with the third color light-emitting element 20, the first aperture 8 is closer to the first color light-emitting element 18 and the second color light-emitting element 19, and after the first color light emitted from the first color light-emitting element 18 and the second color light emitted from the second color light-emitting element 19 are reflected by the finger. In this regard, it is easier for the light to enter the fingerprint recognition module through the first aperture 8, thereby increasing the amount of detection light that enters the fingerprint recognition module and thus improving the recognition accuracy. Moreover, since green light has a greater influence on color deviation, making the first aperture 8 closer to the second color light-emitting element 19 can also reduce an amount of green light that exits from the panel after passing through the first aperture 8. Such a configuration reduces an influence of green light on color deviation in a visible angle.

In addition, if an excessive number of first apertures 8 are provided, the distribution of the first apertures 8 will be so dense to cause the detection light at different positions to interfere with each other and also aggravate the color deviation phenomenon; and if an excessive number of first apertures 8 are provided, the amount of detection light collected by the fingerprint recognition module will be insufficient, resulting in low fingerprint recognition accuracy.

For this reason, referring to FIG. 16 to FIG. 21 again, in this embodiment of the present disclosure, one light-emitting unit 23 is constituted by one first color light-emitting element 18, one second color light-emitting element 19, and one third color light-emitting element 20; and the display region 101 includes a plurality of first areas 24, each of which is provided with one light-emitting unit 23 and one first aperture 8. In this case, the number of first apertures 8 is moderate, thereby weakening the color deviation phenomenon. Moreover, the above-mentioned structure will also make multiple first apertures 8 evenly distributed in the display region 101, thereby improving uniformity of the detection light that is reflected from different positions of the finger and collected by the fingerprint recognition module, and thus further improving the fingerprint recognition accuracy.

Figure 24:
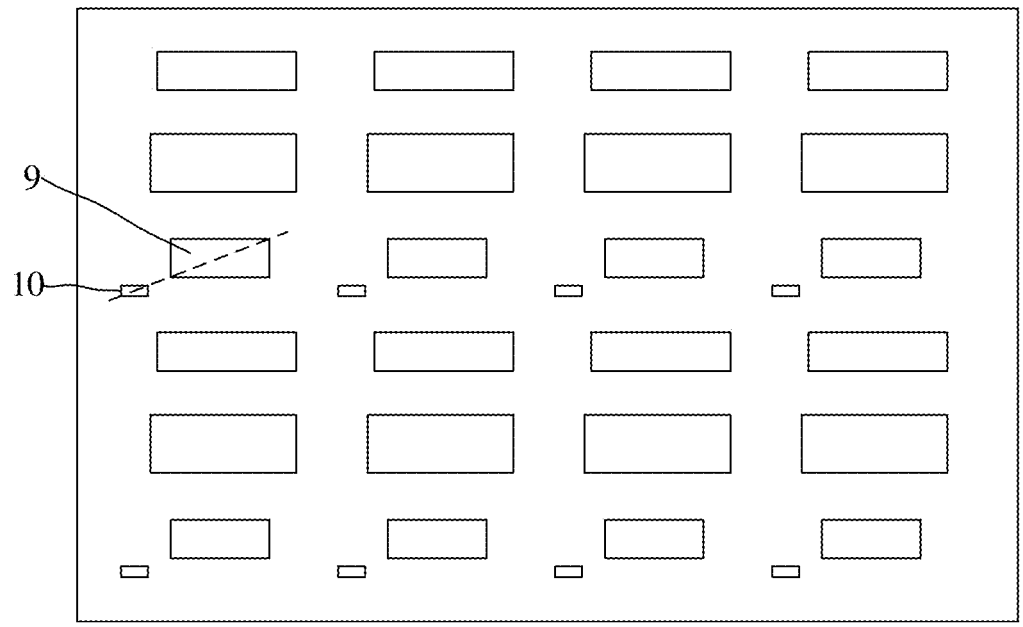
FIG. 24 is another schematic diagram illustrating an arrangement of the first orthographic projection and second orthographic projection according to an embodiment of the present disclosure.

In an embodiment, as shown in FIG. 24, which is another schematic diagram illustrating an arrangement of first orthographic projections 9 and second orthographic projections 10 according to an embodiment of the present disclosure, both a shape of the orthographic projection 9 and a shape of the orthographic projection 10 are rectangular. Under the condition that the distance L between the second orthographic projection 10 and the first orthographic projection 9 adjacent to the second orthographic projection 10 is constant, the extension of the diagonal of the first orthographic projection 9 can be configured to coincide with the extension of the diagonal of at least one second orthographic projection 10 adjacent to the first orthographic projection 9. As a result, the first orthographic projection 9 may be away from the adjacent second orthographic projection 10 as far as possible to further reduce the amount of light that exits from the panel after passing through the first aperture 8.

Figure 25:
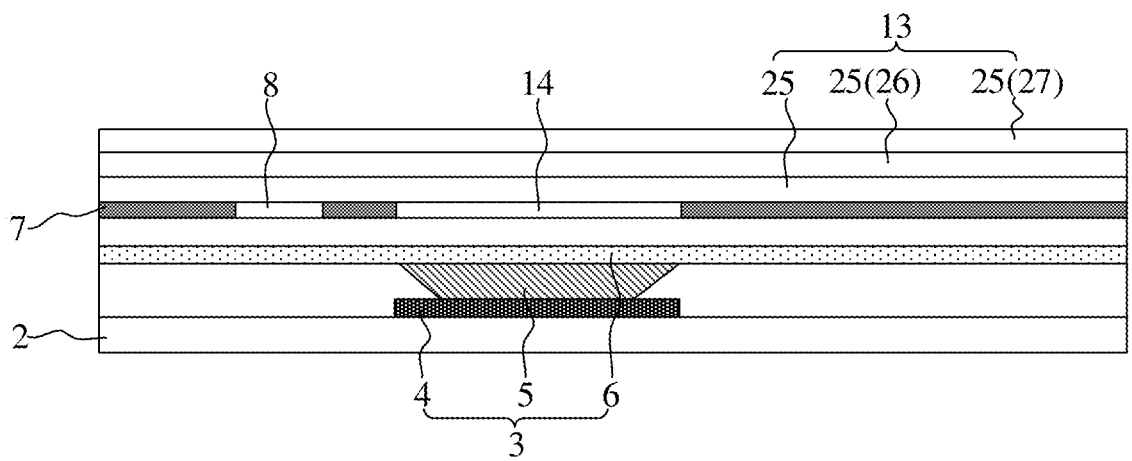
FIG. 25 is a structural schematic diagram of a functional film layer according to an embodiment of the present disclosure.

In an embodiment, as shown in FIG. 25, which is a structural schematic diagram of a functional film layer 13 according to an embodiment of the present disclosure, the functional film layer 13 includes at least two functional layers 25 stacked in a direction perpendicular to the plane of the substrate 2. In any two functional layers 25, the functional layer 25 close to the substrate 2 is a first functional layer 26, and the functional layer 2 away from the substrate 2 is a second functional layer 27. A refractive index of the first functional layer 26 is greater than a refractive index of the second functional layer 27. With this configuration, after light that emits from the first aperture 8 is refracted at an interface between two adjacent functional layers 25, the refraction angle will increase, so that the light that finally exits from the panel is more likely to be transmitted outside the visible angle range, thereby further avoiding color deviation caused by light that emits from the first aperture 8.

Figure 26:
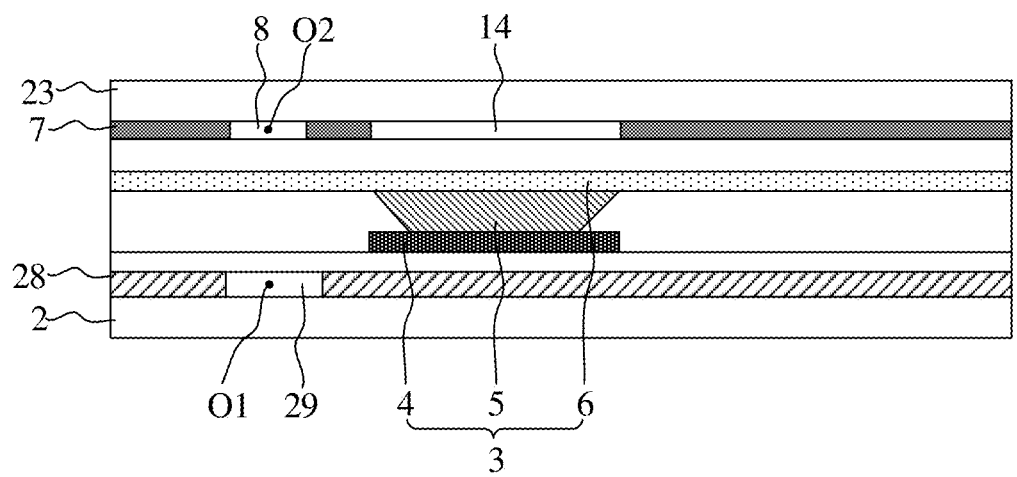
FIG. 26 is a structural schematic diagram of a light-blocking layer according to an embodiment of the present disclosure.

In an embodiment, as shown in FIG. 26, which is a structural schematic diagram of a light-blocking layer 28 according to an embodiment of the present disclosure, the display panel further includes a light-blocking layer 28, and the light-blocking layer 28 is located at a side of the light-emitting element 3 facing the substrate 2, so as to block stray light, thereby preventing stray light from interfering with fingerprint recognition. The light-blocking layer 28 includes a plurality of light-transmission holes 29 one-to-one corresponding to the plurality of first apertures 8. In the direction perpendicular to the plane of the substrate 2, the light-transmitting hole 29 overlaps with the first aperture 8, and an outer diameter of the light-transmitting hole 29 is greater than an outer diameter of the first aperture 8 corresponding thereto.

It can be understood that the detection light reflected by the finger is divergent and transmitted in various directions, rather than only in the direction perpendicular to the substrate 2. By setting the outer diameter of the light-transmission hole 29 to be larger, after the detection light enters through the first aperture 8, less detection light that is obliquely transmitted will be blocked by the light-transmission hole 29, so that the detection light that is obliquely transmitted can be transmitted to the fingerprint recognition module through the light-transmission hole 29 as much as possible. In this way, the amount of detection light that is collected by the fingerprint recognition module can be increased, thereby forming a clearer fingerprint image and thus improving the recognition accuracy.

Further, referring to FIG. 26 again, in the direction perpendicular to the plane of the substrate 2, a geometric center point O1 of the light-transmission hole 29 coincides with a geometric center point O2 of the first aperture 8 corresponding thereto. In this case, a central axis of the light-transmission hole 29 coincides with a central axis of the first aperture 8, and the light-transmission hole 29 is arranged directly opposite to the first aperture 8. When the detection light reflected by the finger sequentially passes through the first aperture 8 and the light-transmission hole 29, the transmission uniformity of the detection light transmitted in different directions can be improved, thereby allowing the amount of detection light transmitted in different directions finally collected by the fingerprint recognition module tend to be the same, and thus improving the fingerprint recognition accuracy.

Figure 27:
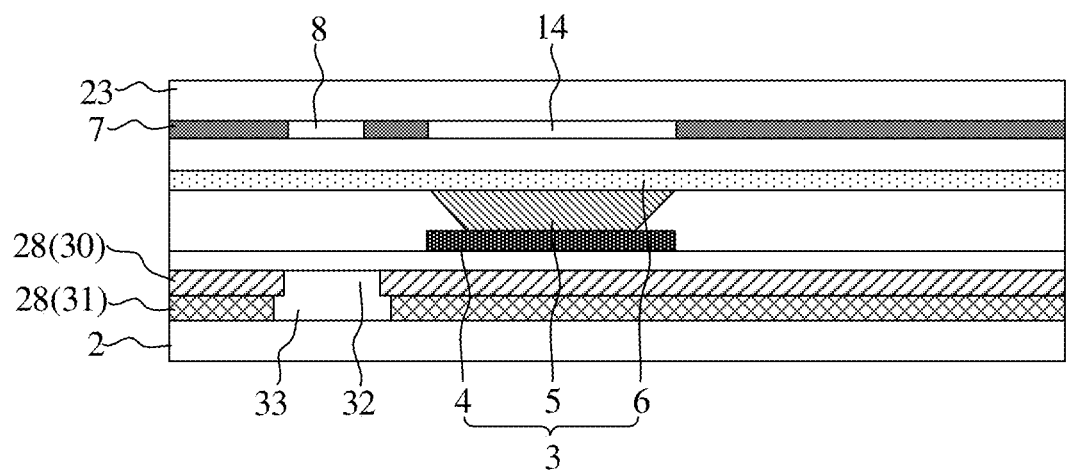
FIG. 27 is another structural schematic diagram of a light-blocking layer according to an embodiment of the present disclosure.

In an embodiment, as shown in FIG. 27, which is another structural schematic diagram of a light-blocking layer 28 according to an embodiment of the present disclosure, the light-blocking layer 28 includes a first light-blocking layer 30 and a second light-blocking layer 31. The second light-blocking layer 31 is located between the first light-blocking layer 30 and the substrate 2. The first light-blocking layer 30 includes a first light-transmission hole 32, and in the direction perpendicular to the plane of the substrate 2, the first light-transmission hole 32 overlaps with the first aperture 8, and an outer diameter of the first light-transmission hole 32 is greater than an outer diameter of the first aperture 8 corresponding thereto. The second light-blocking layer 31 includes a second light-transmission hole 33, and in the direction perpendicular to the plane of the substrate 2, the second light-transmission hole 33 overlaps with the first light-transmission hole 32, and an outer diameter of the second light-transmission hole 33 is greater than an outer diameter of the first light-transmission hole 32 that overlaps with the second light-transmission hole 33.

Due to limitations in the manufacturing processes, a single-layer light-blocking layer 28 cannot be made too thick. By making the first light-blocking layer 30 and the second light-blocking layer 31 stacked up on one another, the light-blocking layer 28 can guarantee to have a larger thickness to improve the light shielding effect, meanwhile, the difficulty in the manufacturing process can be reduced. Moreover, the outer diameter of the first aperture 8 is smaller than the outer diameter of the first light-transmission hole 32, and the outer diameter of the first light-transmission hole 32 is smaller than the outer diameter of the second light-transmission hole 33. The extent of shielding the obliquely transmitted detection light by the first light-transmission hole 32 and the second light-transmission hole 33 is, thereby reduced. Thus the amount of detection light that can finally enter the fingerprint recognition module is increased.

Figure 28:
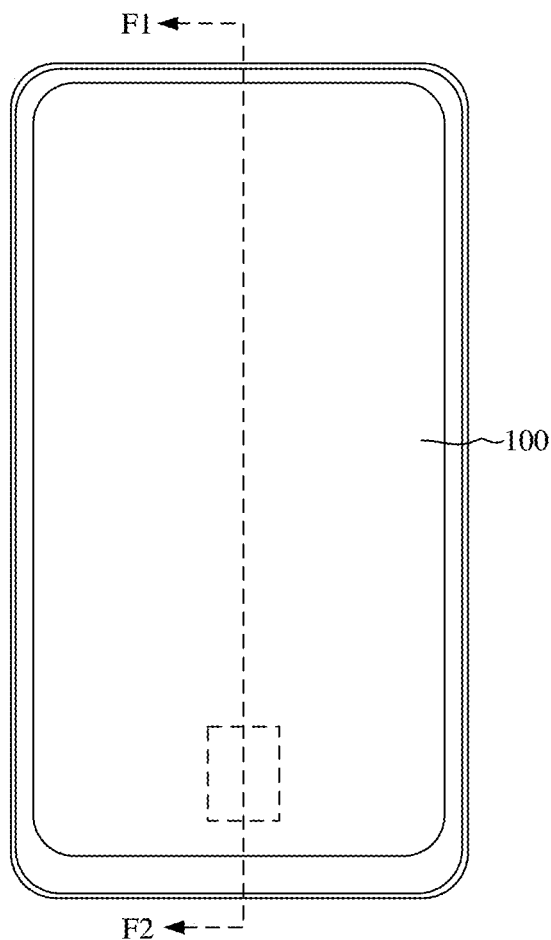
FIG. 28 is a structural schematic diagram of a display device according to an embodiment of the present disclosure.
Figure 29:
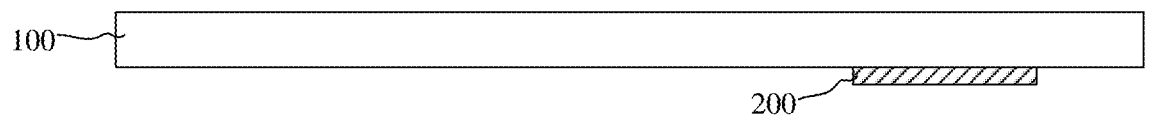
FIG. 29 is a cross-sectional view along F1-F2 direction shown in FIG. 28 according to an embodiment of the present disclosure.

Based on the same inventive concept, an embodiment of the present disclosure provides a display device. FIG. 28 is a structural schematic diagram of a display device according to an embodiment of the present disclosure, and FIG. 29 is a cross-sectional view along F1-F2 direction shown in FIG. 28. As shown in FIG. 28 and FIG. 29, the display device includes the display panel 100 and the fingerprint recognition module 200 described above. The structure of the display panel 100 has already been described in detail in the above embodiments, and will not be repeated herein. It should be noted that the display device shown in FIG. 26 is merely for schematic illustration, and the display device may be any electronic device with a display function, such as a mobile phone, a tablet computer, a laptop computer, an e-book, or a television.

The above-described embodiments are merely preferred embodiments of the present disclosure and are not intended to limit the present disclosure. Various changes and modifications can be made to the present disclosure by those skilled in the art. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, having a display region and a non-display region, the display panel comprising:
a substrate;
a plurality of light-emitting elements disposed at a side of the substrate and located in the display region, wherein each light-emitting element of the plurality of light-emitting elements comprises a light-emitting layer; and
a light-shielding layer disposed at a side of the plurality of light-emitting elements facing away from the substrate, wherein the light-shielding layer comprises a first aperture, and, in a direction perpendicular to a plane of the substrate, the first aperture does not overlap with the light-emitting layer,
wherein an orthographic projection of the light-emitting layer on the substrate is defined as a first orthographic projection, an orthographic projection of the first aperture on the substrate is defined as a second orthographic projection, an edge of the first orthographic projection comprises a first point, an edge of the second orthographic projection comprises a second point, a distance between the first point and the second point is defined as a distance between the first orthographic projection and the second orthographic projection, and the distance L between the second orthographic projection and at least one first orthographic projection adjacent to the second orthographic projection satisfies $$L \geq \frac{d \times \sin\theta}{\sqrt{n^2 - \sin^2\theta}},$$

wherein d denotes a distance between the light-emitting layer and the light-shielding layer, n denotes a refractive index of a functional film layer of the display panel located at a side of the light-shielding layer facing away from the substrate, and θ denotes a visible angle of the display panel and 0°<θ<90°;
wherein a minimum distance between the first point and the second point is defined as a minimum distance between the first orthographic projection and the second orthographic projection, and
wherein the plurality of light-emitting elements comprises a first light-emitting element and a second light-emitting element, and wherein a light-emitting efficiency of the first light-emitting element is greater than a light-emitting efficiency of the second light-emitting element, and a minimum distance $L_{min\_1}$ between the second orthographic projection and the first orthographic projection of the first light-emitting element adjacent to the second orthographic projection is greater than a minimum distance $L_{min\_2}$ between the second orthographic projection and the first orthographic projection of the second light-emitting element adjacent to the second orthographic projection.

2. The display panel according to claim 1, wherein a maximum distance between the first point and the second point is defined as a maximum distance between the first orthographic projection and the second orthographic projection, and the maximum distance $L_{max}$ between the second orthographic projection and at least one first orthographic projection adjacent to the second orthographic projection satisfies $$L_{max} \geq \frac{d \times \sin\theta}{\sqrt{n^2 - \sin^2\theta}}.$$

3. The display panel according to claim 1, wherein the minimum distance $L_{min}$ between the second orthographic projection and at least one first orthographic projection adjacent to the second orthographic projection satisfies $$L_{min} \geq \frac{d \times \sin\theta}{\sqrt{n^2 - \sin^2\theta}}.$$

4. The display panel according to claim 3, wherein the minimum distance $Lm_{,,}$ between the second orthographic projection and each of the at least one first orthographic projection adjacent to the second orthographic projection satisfies $$L_{min} \geq \frac{d \times \sin\theta}{\sqrt{n^2 - \sin^2\theta}}.$$

5. The display panel according to claim 3,
wherein the minimum distance $L_{min\_1}$ between the second orthographic projection and the first orthographic projection of the first light-emitting element adjacent to the second orthographic projection satisfies $$L_{min\_1} \geq \frac{d \times \sin\theta}{\sqrt{n^2 - \sin^2\theta}},$$

and the minimum distance $L_{min\_2}$ between the second orthographic projection and the first orthographic projection of the second light-emitting element adjacent to the second orthographic projection satisfies $$L_{min\_2} < \frac{d \times \sin\theta}{\sqrt{n^2 - \sin^2\theta}}.$$

6. The display panel according to claim 1, wherein the distance L satisfies $$L \geq \frac{d \times \sin 30°}{\sqrt{n^2 - \sin^2 30°}}.$$

7. The display panel according to claim 1, wherein the distance L satisfies $$L \geq \frac{d \times \sin 70°}{\sqrt{n^2 - \sin^2 70°}}.$$

8. The display panel according to claim 1, wherein
the plurality of light-emitting elements comprises a first color light-emitting element configured to emit first color light, a second color light-emitting element configured to emit second color light, and a third color light-emitting element configured to emit third color light, wherein the first color light is detection light suitable for fingerprint recognition; and a distance between the second orthographic projection and a first orthographic projection of the first color light-emitting element adjacent to the second orthographic projection is L_1, a distance between the second orthographic projection and a first orthographic projection of the second color light-emitting element adjacent to the second orthographic projection is L_2, and a distance between the second orthographic projection and a first orthographic projection of the third color light-emitting element adjacent to the second orthographic projection is L_3, wherein L_1<L_2 and L_1<L_3.

9. The display panel according to claim 8, wherein
a color of the first color light is green; and
a minimum distance between the first point and the second point is defined as a minimum distance between the first orthographic projection and the second orthographic projection, and the minimum distance $L_{min\_}11$ between the second orthographic projection and the first orthographic projection of the first color light-emitting element adjacent to the second orthographic projection satisfies $$L_{min\_}11 \geq \frac{d \times \sin\theta}{\sqrt{n^2 - \sin^2\theta}}.$$

10. The display panel according to claim 8, wherein
a color of the first color light is blue;
a maximum distance between the first point and the second point is defined as a maximum distance between the first orthographic projection and the second orthographic projection, and the maximum distance $L_{max\_}1$ between the second orthographic projection and the first orthographic projection of the first color light-emitting element adjacent to the second orthographic projection satisfies $$L_{max\_}1 \geq \frac{d \times \sin\theta}{\sqrt{n^2 - \sin^2\theta}};$$

and
a minimum distance between the first point and the second point is defined as a minimum distance between the first orthographic projection and the second orthographic projection, and the minimum distance $L_{min\_}12$ between the second orthographic projection and the first orthographic projection of the first color light-emitting element adjacent to the second orthographic projection satisfies $$L_{min\_}12 < \frac{d \times \sin\theta}{\sqrt{n^2 - \sin^2\theta}}.$$

11. The display panel according to claim 8, wherein the light-shielding layer further comprises a plurality of first apertures, and the substrate comprises a plurality of second orthographic projections; and wherein the first orthographic projection of the first color light-emitting element has a same distance to each of the plurality of second orthographic projections adjacent to the first orthographic projection of the first color light-emitting element.

12. The display panel according to claim 8, further comprising:
first color filter blocks disposed at the side of the plurality of light-emitting elements facing away from the substrate, wherein a color of the first color filter blocks is a first color, and wherein, in the direction perpendicular to the plane of the substrate, the first color filter blocks overlap with the first apertures.

13. The display panel according to claim 8, wherein one light-emitting unit comprises one first color light-emitting element, one second color light-emitting element, and one third color light-emitting element; and wherein the display region comprises a plurality of first areas each having one light-emitting unit and one first aperture.

14. The display panel according to claim 1, wherein
the plurality of light-emitting elements comprises a first color light-emitting element configured to emit first color light, a second color light-emitting element configured to emit second color light, and a third color light-emitting element configured to emit third color light, wherein the first color light and the second color light are detection light suitable for fingerprint recognition, and a color of the first color light is green and a color of the second color light is blue; and a distance between the second orthographic projection and the first orthographic projection of the first color light-emitting element adjacent to the second orthographic projection is L_1', a distance between the second orthographic projection and the first orthographic projection of the second color light-emitting element adjacent to the second orthographic projection is L_2', and a distance between the second orthographic projection and the first orthographic projection of the third color light-emitting element adjacent to the second orthographic projection is L_3', wherein L_2'<L_1'<L_3'.

15. The display panel according to claim 14, wherein one light-emitting unit comprises one first color light-emitting element, one second color light-emitting element, and one third color light-emitting element; and wherein the display region comprises a plurality of first areas each having one light-emitting unit and one first aperture.

16. The display panel according to claim 1, wherein the light-shielding layer further comprises a plurality of first apertures, and the substrate comprises a plurality of second orthographic projections; and wherein both a shape of the first orthographic projection and a shape of each of the plurality of second orthographic projections is rectangular, and wherein an extension of a diagonal line of the first orthographic projection coincides with an extension of a diagonal line of at least one of the second orthographic projections adjacent to the first orthographic projection.

17. The display panel according to claim 1, wherein
the functional film layer comprises at least two functional layers stacked in the direction perpendicular to the plane of the substrate; and
in any two functional layers of the at least two functional layers, a first functional layer is positioned adjacent to the substrate, and a second functional layer of the at least two functional layers is positioned away from the substrate, and a refractive index of the first functional layer is greater than a refractive index of the second functional layer.

18. The display panel according to claim 1, further comprising a light-blocking layer disposed at a side of the plurality of light-emitting elements facing the substrate,
   wherein the light-shielding layer comprises a plurality of first apertures, the light-blocking layer comprises light-transmission holes corresponding one-to-one to the plurality of first apertures; and
   wherein in the direction perpendicular to the plane of the substrate, the light-transmission holes overlap with the first apertures, and an outer diameter of each of the light-transmission holes is greater than an outer diameter of a corresponding first aperture.

19. The display panel according to claim 18, wherein in the direction perpendicular to the plane of the substrate, a geometric center point of each of the light-transmission holes coincides with a geometric center point of the corresponding first aperture.

20. The display panel according to claim 18, wherein
   the light-blocking layer comprises a first light-blocking layer and a second light-blocking layer, and the second light-blocking layer is located between the first light-blocking layer and the substrate;
   the first light-blocking layer comprises first light-transmission holes, and, in the direction perpendicular to the plane of the substrate, the first light-transmission holes overlap with the first apertures, and an outer diameter of each of the light-transmission holes is greater than an outer diameter of a corresponding first aperture; and
   the second light-blocking layer comprises second light-transmission holes, and, in the direction perpendicular to the plane of the substrate, the second light-transmission holes overlap with the first light-transmission holes, and an outer diameter of each of the second light-transmission holes is greater than an outer diameter of the first light-transmission hole that overlaps with the second light-transmission hole.

* * * * *